US012432857B2

(12) United States Patent
Tominaga

(10) Patent No.: US 12,432,857 B2
(45) Date of Patent: Sep. 30, 2025

(54) COMPONENT MOUNT BOARD

(71) Applicant: MEKTEC CORPORATION, Tokyo (JP)

(72) Inventor: Azumi Tominaga, Tokyo (JP)

(73) Assignee: MEKTEC CORPORATION, Tokyo (JP)

(*) Notice: Subject to any disclaimer, the term of this patent is extended or adjusted under 35 U.S.C. 154(b) by 157 days.

(21) Appl. No.: 18/468,832

(22) Filed: Sep. 18, 2023

(65) Prior Publication Data

US 2024/0172366 A1 May 23, 2024

(30) Foreign Application Priority Data

Nov. 21, 2022 (JP) ................. 2022-185807

(51) Int. Cl.
*H05K 1/03* (2006.01)
*H05K 1/18* (2006.01)
*H05K 3/00* (2006.01)
*H05K 3/28* (2006.01)
*H05K 3/30* (2006.01)

(52) U.S. Cl.
CPC ........... *H05K 1/182* (2013.01); *H05K 1/0313* (2013.01); *H05K 3/0044* (2013.01); *H05K 3/28* (2013.01); *H05K 3/305* (2013.01); *H05K 2203/0191* (2013.01); *H05K 2203/0756* (2013.01)

(58) Field of Classification Search
CPC ............................... H05K 1/0313; H05K 3/28
See application file for complete search history.

(56) References Cited

U.S. PATENT DOCUMENTS

| | | | |
|---|---|---|---|
| 2010/0155940 A1* | 6/2010 | Kawashita | H01L 25/0657 257/737 |
| 2013/0036802 A1 | 2/2013 | Johnson et al. | |
| 2016/0359115 A1* | 12/2016 | Koizumi | C23C 18/285 |

FOREIGN PATENT DOCUMENTS

JP 2014-529732 A 11/2014

* cited by examiner

*Primary Examiner* — Sherman Ng
(74) *Attorney, Agent, or Firm* — Studebaker Brackett PLLC

(57) ABSTRACT

Provided is a component mount board which includes: a board having a base, a first conductive pattern, a mount component connected to the first conductive pattern, and a soluble layer; and a second conductive pattern, in which the soluble layer is soluble in liquid, and the second conductive pattern is soluble in liquid or is weakened when getting wet with liquid, the base has, in a portion of the base corresponding to the second conductive pattern, a first missing portion the first conductive pattern has a first portion and a second portion separated from the first portion through the first missing portion, the second conductive pattern connects, over the first missing portion, the first and second portions of the first conductive pattern to each other, and a portion of the second conductive pattern at least over the first missing portion is formed on a first surface of the soluble layer.

18 Claims, 17 Drawing Sheets

COMPONENT MOUNT BOARD

CROSS-REFERENCE TO RELATED APPLICATION

This application claims priority from Japanese Patent Application No. 2022-185807 filed with the Japan Patent Office on Nov. 21, 2022, the entire content of which is hereby incorporated by reference.

BACKGROUND

1. Technical Field

The present disclosure relates to a component mount board.

2. Related Art

JP-T-2014-529732 describes a component mount board (sensor) including a board and a tuned radio frequency circuit supported by the board, and the tuned radio frequency circuit has a first conductive pattern, a first capacitor, and a jumper all arranged on the same side of the board. The first capacitor includes a first capacitor plate, a second capacitor plate, and a first dielectric material arranged between the first capacitor plate and the second capacitor plate, and the first dielectric material is soluble in liquid.

SUMMARY

A component mount board according to an embodiment of the present disclosure is configured such that the component mount board includes: a board having a base, a first conductive pattern formed on the base, a mount component electrically connected to the first conductive pattern, and a soluble layer; and a second conductive pattern, in which the soluble layer is soluble in liquid, and the second conductive pattern is soluble in liquid or is weakened when getting wet with liquid, the base has, in a portion of the base corresponding to the second conductive pattern, a first missing portion where the base is missing, the first conductive pattern has a first portion and a second portion separated from the first portion through the first missing portion, the second conductive pattern connects, over the first missing portion, the first and second portions of the first conductive pattern to each other, and a portion of the second conductive pattern at least over the first missing portion is formed on a first surface of the soluble layer.

DETAILED DESCRIPTION

Figure 1:
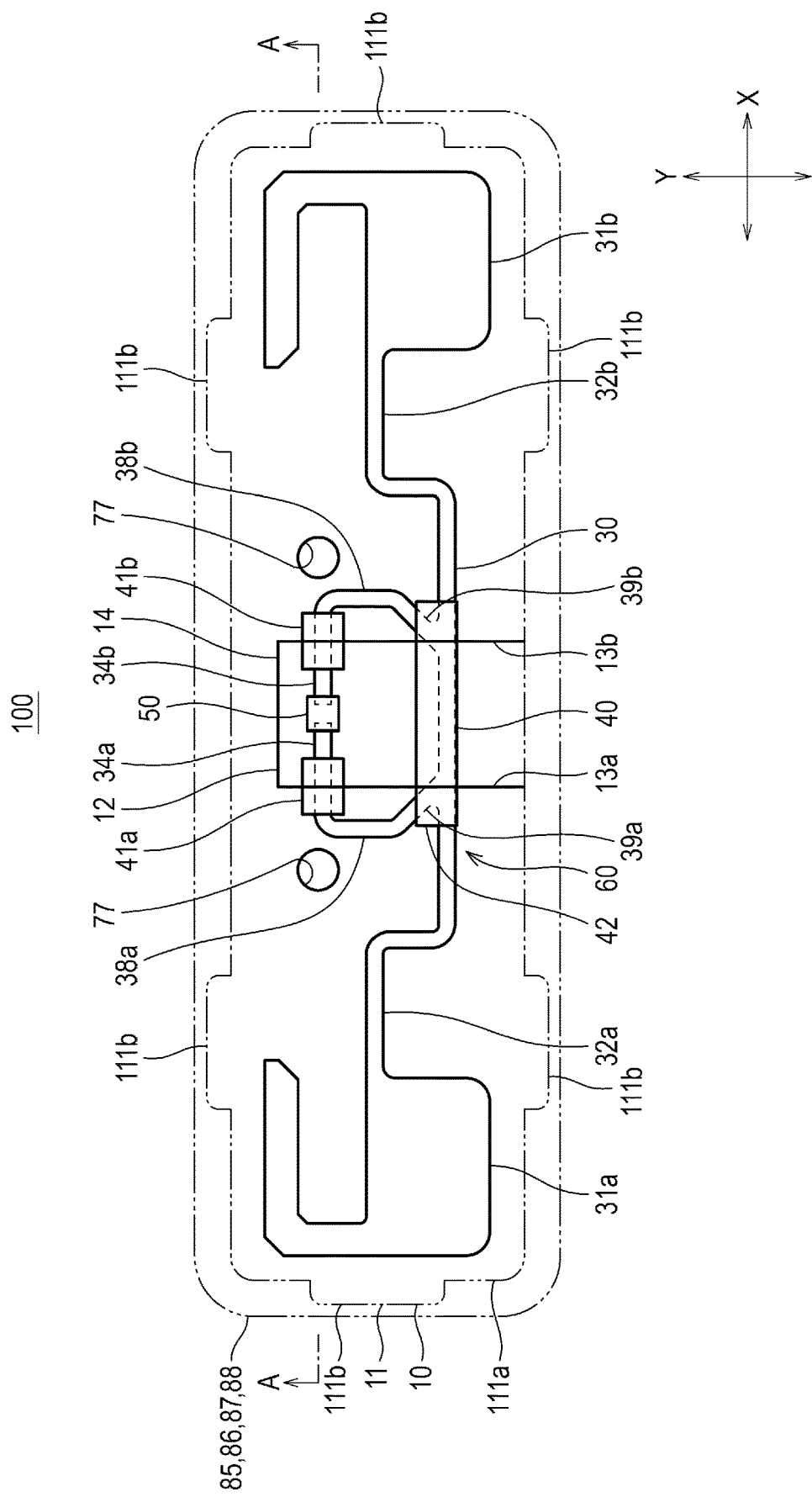
FIG. 1 is a plan view of a component mount board according to a first embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to study conducted by the inventor(s) of the present application, there is still room for improvement in the component mount board of JP-T-2014-529732 in terms of reliability in sensing a state of the component mount board being soaked in liquid.

The present disclosure has been made in view of the above-described problems, and provides a component mount board having a structure capable of more reliably sensing a state of the component mount board being soaked in liquid.

A component mount board according to an aspect of the present disclosure includes: a board having a base, a first conductive pattern formed on the base, a mount component electrically connected to the first conductive pattern, and a soluble layer; and a second conductive pattern, in which the soluble layer is soluble in liquid, and the second conductive pattern is soluble in liquid or is weakened when getting wet with liquid, the base has, in a portion of the base corresponding to the second conductive pattern, a first missing portion where the base is missing, the first conductive pattern has a first portion and a second portion separated from the first portion through the first missing portion, the second conductive pattern connects, over the first missing portion, the first and second portions of the first conductive pattern to each other, and a portion of the second conductive pattern at least over the first missing portion is formed on a first surface of the soluble layer.

According to the present disclosure, the state of the component mount board being soaked in liquid can be more reliably sensed.

First Embodiment

Figure 3:
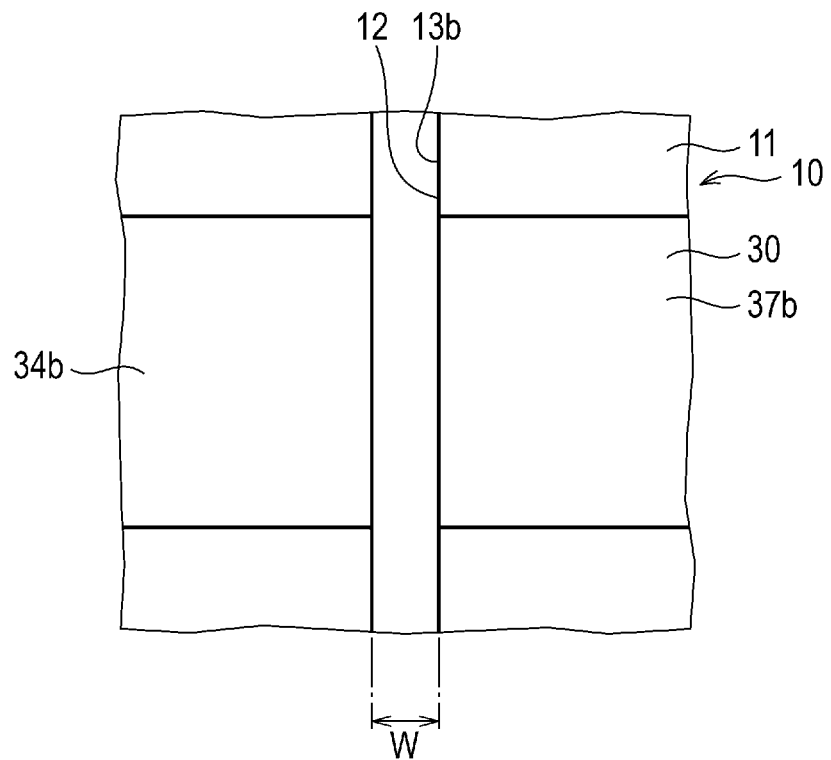
FIG. 3 is a partially-enlarged view of a portion A shown in FIG. 2.
Figure 4:
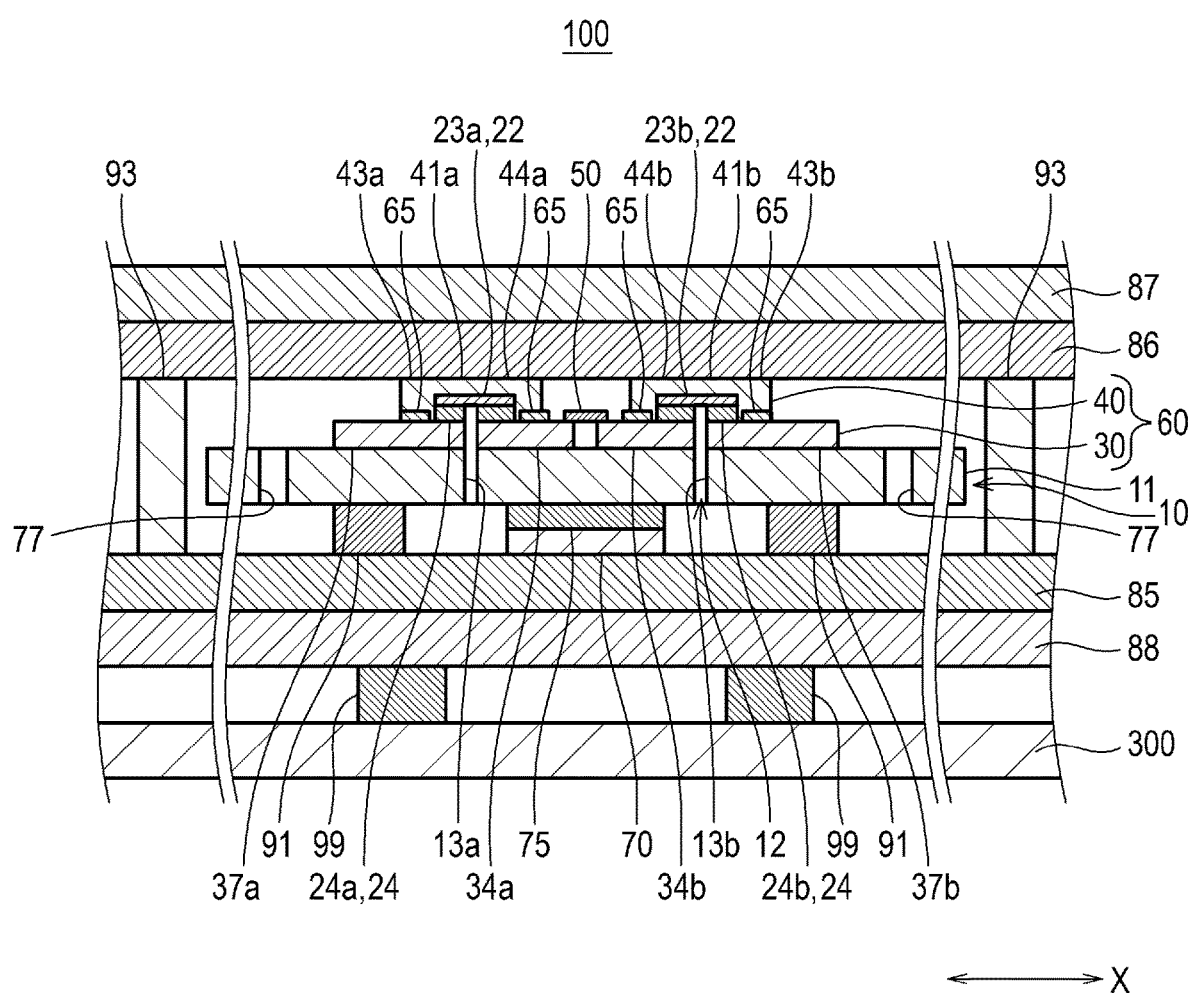
FIG. 4 is an end view of the component mount board according to the first embodiment.
Figure 6:
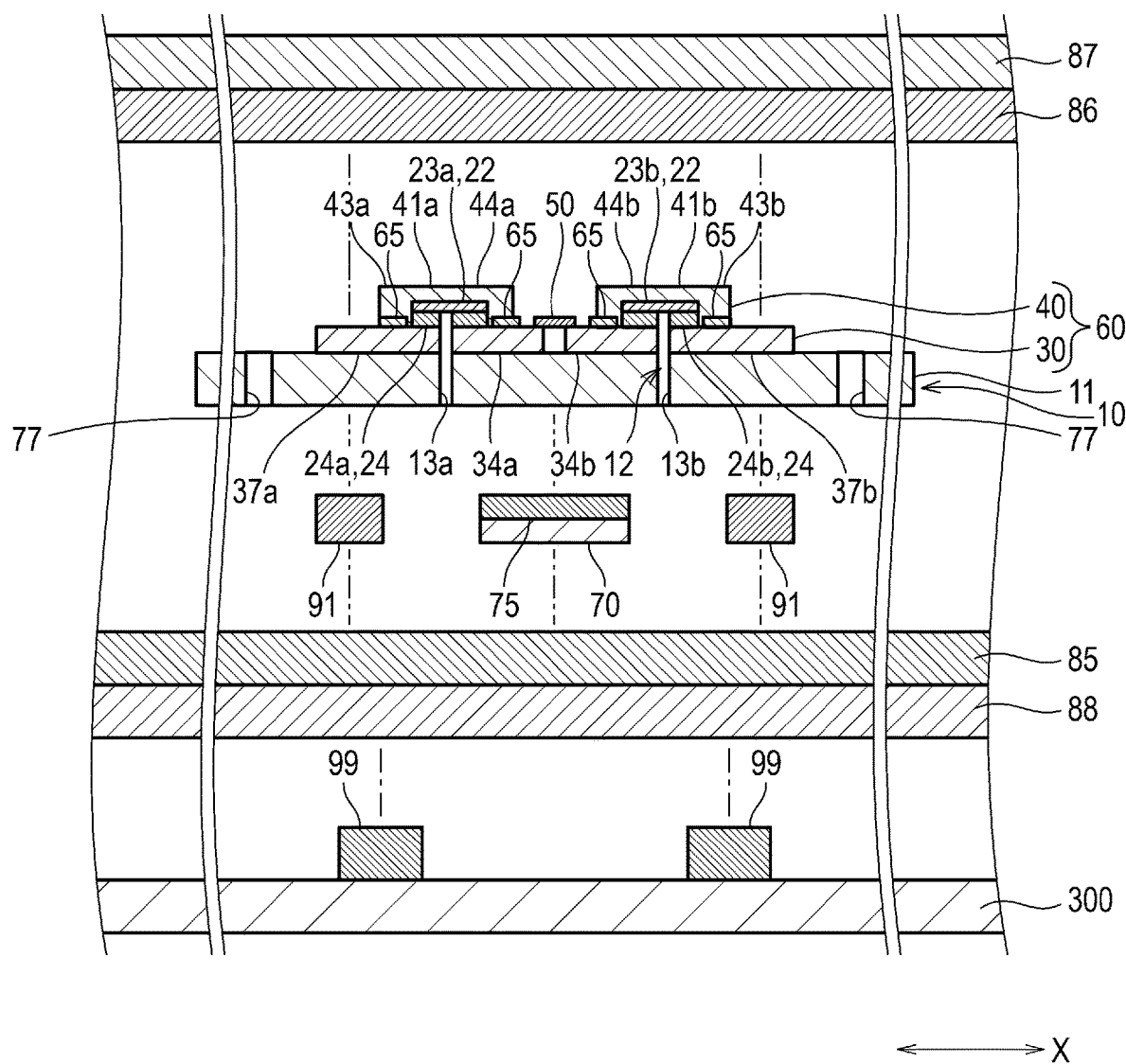
FIG. 6 is an exploded end view of the component mount board according to the first embodiment.
Figure 7:
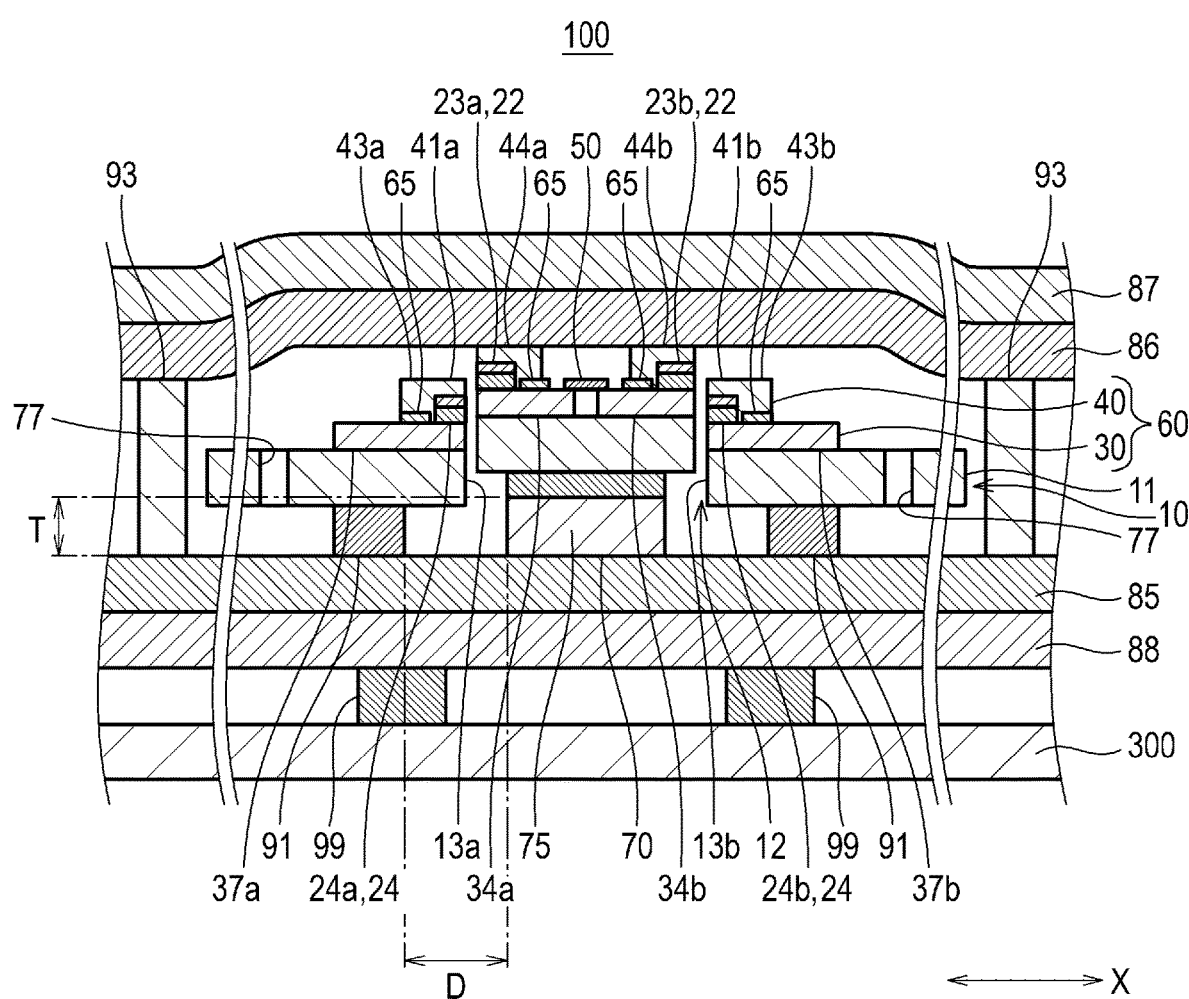
FIG. 7 is an end view of the component mount board according to the first embodiment in a state of a water-absorption expansion material being expanded.

Hereinafter, a first embodiment of the present disclosure will be described with reference to FIGS. 1 to 7. Note that in all the drawings, the same reference numerals are used to represent similar components and description thereof will be omitted as necessary. In FIG. 1, a base 11, a first water-conducting sheet 85, a second water-conducting sheet 86, a first water permeable sheet 87, and a second water permeable sheet 88 are indicated by chain double-dashed lines. In FIG. 3, a first conductive pattern 30 and a missing portion 12 are selectively shown, and other portions are not shown. FIG. 4 shows a cut end surface along an A-A line shown in FIG. 1. FIGS. 6 and 7 are exploded end views of a portion corresponding to FIG. 4. In FIGS. 4 to 7, the thickness of each layer is schematically shown thick for the sake of convenience in easy understanding of a layer structure of a component mount board 100.

As shown in FIGS. 1 to 7, the component mount board 100 according to the present embodiment includes a board 10 having the base 11, the first conductive pattern 30 formed on the base 11, and a mount component 50 electrically connected to the first conductive pattern 30 and a second conductive pattern 40 forming a circuit 60 together with the first conductive pattern 30 in a complementary manner.

A portion of the base 11 corresponding to the second conductive pattern 40 has the missing portion 12 where the base 11 is missing. The second conductive pattern 40 connects, over the missing portion 12, a portion of the first conductive pattern 30 and another portion of the first conductive pattern 30 to each other.

The component mount board 100 further includes a soluble layer 22. The soluble layer 22 is arranged on the same side as that of the first conductive pattern 30 with respect to the base 11. The soluble layer 22 is soluble in liquid.

The second conductive pattern 40 is soluble in liquid, or is weakened when getting wet with liquid. A portion of the second conductive pattern 40 at least over the missing portion 12 is formed on one surface of the soluble layer 22.

In the present embodiment, the one surface of the soluble layer 22 is a surface of the soluble layer 22 opposite to the base 11 side, and the other surface of the soluble layer 22 is a base-11-side surface of the soluble layer 22. Note that the one surface of the soluble layer 22 may be referred to as a first surface of the soluble layer 22 and the other surface of the soluble layer 22 may be referred to as a second surface of the soluble layer 22. For distinguishing the missing portion 12 from a later-described second missing portion 77, the missing portion 12 may be referred to as a first missing portion.

Here, the soluble layer 22 being soluble in liquid indicates that the soluble layer 22 is dissolved due to contact with liquid. More specifically, the soluble layer 22 being soluble in liquid indicates that liquid contains water and the soluble layer 22 is dissolved due to contact with the water (moisture) in the liquid, for example. That is, the soluble layer 22 is, for example, soluble in water. Note that the soluble layer 22 may be soluble in liquid containing no moisture, such as an organic solvent.

Similarly, the second conductive pattern 40 being soluble in liquid indicates that the second conductive pattern 40 is dissolved or weakened (not fully dissolved, but altered to such an extent that the second conductive pattern 40 is easily disconnected) due to contact with liquid, and more specifically, indicates that the second conductive pattern 40 is dissolved or weakened due to contact with water (moisture), for example. That is, the second conductive pattern 40 is, for example, soluble in water. Note that the second conductive pattern 40 may be soluble or weakened in liquid containing no moisture, such as an organic solvent. More specifically, the second conductive pattern 40 and the soluble layer 22 have properties of being soluble or weakened in the same type of liquid (e.g., water).

It can be expected that the initial properties of the circuit 60 cannot be maintained by breakage, cracking, or dissolving or weakening of the second conductive pattern 40 due to contact with water (moisture). A change in the properties of the circuit 60 (mainly loss of the function of the circuit 60) is detected, and in this manner, a state of the component mount board 100 being soaked in liquid can be sensed.

The soluble layer 22 slightly expands (extends) by absorbing moisture in the air. Moreover, the soluble layer 22 slightly shrinks (contracts) by evaporating moisture contained in the soluble layer 22. That is, the soluble layer 22 extends and contracts in association with a change in ambient humidity. Specifically, a portion of the soluble layer 22 corresponding to the missing portion 12 is not supported by the base 11, and therefore, is more easily extendable and contractable than other portions.

On the other hand, the second conductive pattern 40 substantially holds (does not extend and contract), unlike the soluble layer 22, the shape thereof even when the ambient humidity changes. Thus, in some cases, when the ambient humidity changes, the second conductive pattern 40 cannot follow extension and contraction of the soluble layer 22, and for this reason, stress is generated on the second conductive pattern 40.

According to the present embodiment, part of the portion of the base 11 corresponding to the second conductive pattern 40 is the missing portion 12 where the base 11 is missing.

According to this configuration, when slight external force is applied to the second conductive pattern 40 in a state of the soluble layer 22 being dissolved due to sufficient contact with liquid, it can be expected that the second conductive pattern 40 is easily broken or cracked and the initial properties of the circuit 60 are no longer maintained. Moreover, liquid can sufficiently contact the second conductive pattern 40 through the missing portion 12, and therefore, it can be expected that the second conductive pattern 40 is more reliably dissolved or weakened and the initial properties of the circuit 60 are no longer maintained. That is, the state of the component mount board 100 being soaked in liquid can be more reliably sensed.

Further, the portion of the second conductive pattern 40 at least over the missing portion 12 is formed on the one surface (first surface) of the soluble layer 22 along the one surface.

According to this configuration, the structural strength of the portion of the second conductive pattern 40 over the missing portion 12 can be sufficiently ensured. Thus, even when the soluble layer 22 extends and contracts due to the change in the humidity around the component mount board 100, breakage or cracking of the portion of the second conductive pattern 40 over the missing portion 12 at unintended timing can be reduced.

As described above, according to the present embodiment, the reliability of detection of the state of the component mount board 100 being soaked in liquid can be improved, and the structural stability of the component mount board 100 against the change in the ambient humidity can also be ensured.

More specifically, as described above, the portion of the soluble layer 22 corresponding to the missing portion 12 is a portion more easily extendable and contractable due to the change in the ambient humidity as compared to other portions, i.e., the portion supported by the base 11. The portion of the second conductive pattern 40 over the missing portion 12 is a portion on which stress tends to be concentrated due to extension and contraction of the soluble layer 22.

Figure 17:
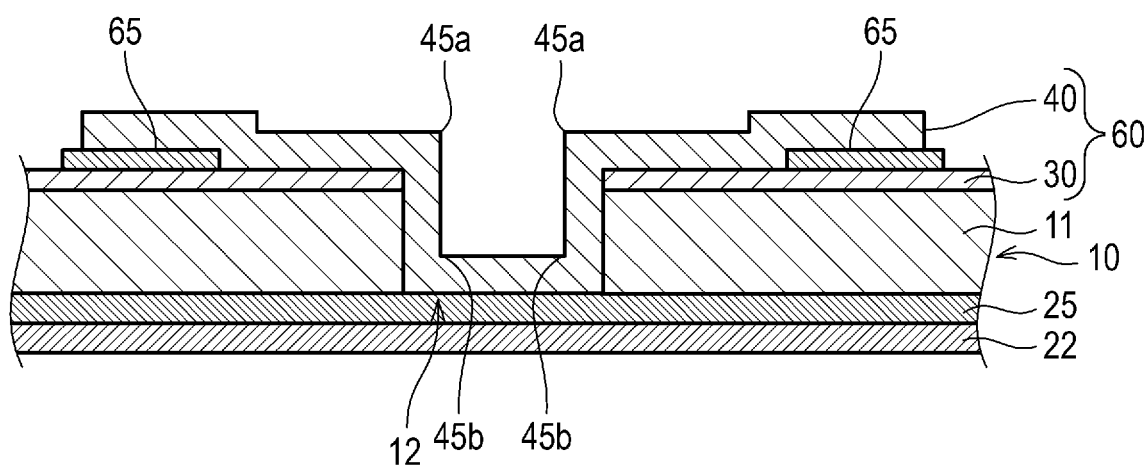
FIG. 17 is an end view showing a missing portion and the peripheral structure thereof in a comparative form.

In a case where the portion of the second conductive pattern 40 over the missing portion 12 is formed inside the missing portion 12 as in a comparative form shown in FIG. 17, such a portion is formed in a recessed shape along the shape of the missing portion 12. That is, the portion of the second conductive pattern 40 over the missing portion 12 is formed in a shape (shape including corner portions 45*a*, 45*b*) bent along the shape of the missing portion 12. Thus, when the soluble layer 22 extends and contracts due to the humidity change, stress is concentrated on the corner portions 45*a*, 45*b* of the second conductive pattern 40 and the vicinity thereof, leading to a probability that the corner portions 45*a*, 45*b* and the vicinity thereof are broken or cracked.

On the other hand, in a case where the portion of the second conductive pattern 40 at least over the missing portion 12 is formed on the one surface (first surface) of the soluble layer 22 as in the present embodiment, such a portion can be formed substantially flat along the soluble layer 22 as described later. Thus, for example, even when the soluble layer 22 extends and contracts due to the humidity change, local stress concentration on the portion of the second conductive pattern 40 over the missing portion 12 can be reduced.

In a case where the portion of the second conductive pattern 40 over the missing portion 12 is formed inside the missing portion 12 as in the comparative form shown in FIG. 17, a sufficiently-great width dimension of the missing portion 12 needs to be ensured in order to continuously form such a portion with no seam. Note that the "width dimension of the missing portion 12" described herein is a dimension in a direction of the second conductive pattern 40 extending over the missing portion 12 (in the case of the present embodiment, X-direction which is the right-left direction in FIGS. 1 to 4).

On the other hand, since the portion of the second conductive pattern 40 over the missing portion 12 is formed on the soluble layer 22 in the case of the present embodiment, such a portion does not need to be formed in a bent shape along the missing portion 12. Thus, the width dimension of the missing portion 12 can be smaller than that of the comparative form.

With this configuration, the width dimension of the portion of the soluble layer 22 corresponding to the missing portion 12, i.e., the portion easily extendable and contractable due to the humidity change, can be smaller. Thus, even when the soluble layer 22 extends and contracts, the stress on the second conductive pattern 40 can be further reduced. Consequently, breakage or cracking of the portion of the second conductive pattern 40 over the missing portion 12 at the unintended timing can be more reliably reduced.

The component mount board 100 is, for example, a laminate formed in a flat plate shape. The planar shape of the component mount board 100 may be, but not specifically limited to, a substantially rectangular shape (e.g., rectangular shape with round corners) as shown in FIG. 1, as one example.

In the case of the present embodiment, the mount component 50 is, as one example, an RFID chip (generally also called an IC chip), and the component mount board 100 is an RFID tag.

Hereinafter, in description of, e.g., a positional relationship among the components of the component mount board 100, the upper side in FIG. 4 will be referred to as an upper side or above, and the opposite side thereof will be referred to as a lower side or below, for example. Moreover, a direction perpendicular to the upper-lower direction will be described as a horizontal direction, for example. However, these directions are defined for the sake of convenience, and are not intended to limit directions upon manufacturing or use of the component mount board 100.

The right-left direction in FIGS. 1 to 4 will be referred to as an X-direction, and the upper-lower direction in FIG. 1 will be referred to as a Y-direction. The X-direction and the Y-direction are directions (horizontal directions) parallel with the planar direction of the component mount board 100, and are perpendicular to the upper-lower direction (direction perpendicular to the plane of the component mount board 100) in FIG. 4.

As shown in FIGS. 1 to 4, in the case of the present embodiment, the missing portion 12 is a slit-shaped cutout forming portion formed in the base 11. The missing portion 12 penetrates the base 11 from the front to the back thereof. In a region where the missing portion 12 is present, the first conductive pattern 30 is not formed.

In the case of the present embodiment, the missing portion 12 linearly extends in plan view. Here, "the missing portion 12 linearly extends in plan view" may indicate that a portion of the missing portion 12 crossing at least the second conductive pattern 40 linearly extends.

More specifically, the missing portion 12 includes, for example, a first extending portion 13*a*, a second extending portion 13*b*, and a third extending portion 14. The first extending portion 13*a* and the second extending portion 13*b* extend in parallel with each other. The third extending portion 14 extends from one end portion (upper end portion in FIG. 1) of the first extending portion 13*a* in the direction of extension thereof to one end portion (upper end portion in FIG. 1) of the second extending portion 13*b* in the direction of extension thereof.

The first extending portion 13*a* and the second extending portion 13*b* have the same shape, and are arranged symmetrically in the right-left direction. More specifically, each of the first extending portion 13*a* and the second extending portion 13*b* linearly extends in the Y-direction in plan view, for example. Moreover, the third extending portion 14 linearly extends in the X-direction in plan view.

The width dimension of the first extending portion 13*a* and the width dimension of the second extending portion 13*b* are set to the equal dimension.

Portions of the base 11 sandwiching the missing portion 12 are arranged at the same height position. More specifically, a left portion of the base 11 with respect to the first extending portion 13*a* and a right portion of the base 11 with respect to the first extending portion 13*a* are arranged at the same height position. Similarly, a left portion of the base 11 with respect to the second extending portion 13*b* and a right portion of the base 11 with respect to the second extending portion 13*b* are arranged at the same height position.

Note that in the present disclosure, the shape of the missing portion 12 is not limited to that of the above-described example. The missing portion 12 is only required to have a shape including a portion crossing at least part of the second conductive pattern 40.

For example, a portion and another portion of the board 10 formed separately may be assembled with a positional relationship adjusted such that the missing portion 12 is formed between these portions. In this case, the first conductive pattern 30 may include a combination of a portion formed on the portion of the board 10 and a portion formed on the other portion of the board 10.

The direction of extension of the first extending portion 13a and the second extending portion 13b is not limited to that of the above-described example, and is only required to be a direction crossing at least the direction of the second conductive pattern 40 extending over the missing portion 12.

The first extending portion 13a and the second extending portion 13b may extend in different directions, for example.

The width dimension of the missing portion 12 is preferably 1.5 mm or less.

With this configuration, the amount of extension and contraction of the soluble layer 22 due to the change in the ambient humidity can be further reduced. Thus, breakage or cracking of the portion of the second conductive pattern 40 over the missing portion 12 at the unintended timing can be more reliably reduced.

More specifically, the width dimension of the portion of the missing portion 12 crossing at least the second conductive pattern 40 is preferably 1.5 mm or less.

The width dimension W (see FIG. 3) of each of the first extending portion 13a and the second extending portion 13b is preferably 0.01 mm or more and 0.08 mm or less and more preferably 0.01 mm or more and 0.02 mm or less. In the case of the present embodiment, the width dimension W of each of the first extending portion 13a and the second extending portion 13b is 0.016 mm, as one example.

The width dimension of the third extending portion 14 is preferably 0.01 mm or more and 0.08 mm or less and more preferably 0.01 mm or more and 0.02 mm or less. In the case of the present embodiment, the width dimension of the third extending portion 14 is 0.016 mm, as one example.

As shown in FIG. 4, the first conductive pattern 30 is formed, for example, on the upper surface of the base 11.

In the case of the present embodiment, the first conductive pattern 30 has, as one example, an antenna wiring portion and a component mount wiring portion described below.

The antenna wiring portion of the first conductive pattern 30 includes a first antenna wiring portion located on the left side in FIG. 1 and a second antenna wiring portion located on the right side. The first antenna wiring portion has, for example, a wide portion 31a and a thin portion 32a formed thinner than the wide portion 31a and extending in the X-direction.

For example, in plan view, the wide portion 31a has a first portion having a substantially rectangular shape in plan view and a second portion extending to one side (above in FIG. 1) in the Y-direction from the upper end of a left edge portion of the first portion and further extending to one side (right in FIG. 1) in the X-direction.

For example, in plan view, the thin portion 32a is formed in such a shape that an intermediate portion of the thin portion 32a in the longitudinal direction thereof is bent in the Y-direction. More specifically, each of right and left end portions of the thin portion 32a in the longitudinal direction thereof extends in the X-direction while the intermediate portion in the longitudinal direction extends in the Y-direction, for example, from the right end of the left end portion to the left end of the right end portion.

The left end of the thin portion 32a is connected to the wide portion 31a, and the right end of the thin portion 32a is connected to the component mount wiring portion. The second antenna wiring portion is formed, for example, symmetrical to the first antenna wiring portion in the right-left direction, and has a wide portion 31b and a thin portion 32b. The right end of the thin portion 32b is connected to the wide portion 31b, and the left end of the thin portion 32b is connected to the component mount wiring portion.

Figure 2:
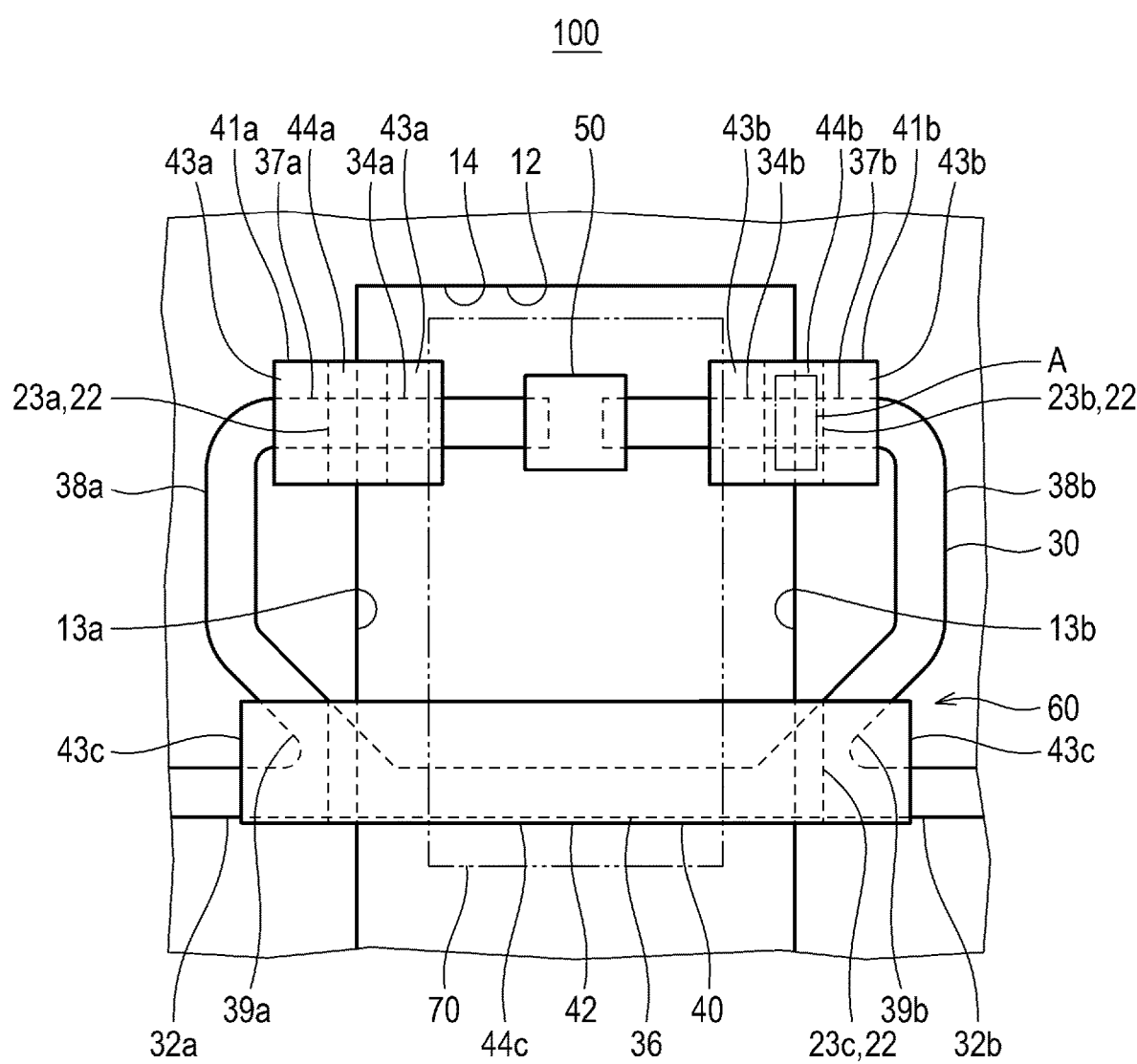
FIG. 2 is a plan view showing a missing portion and the peripheral structure thereof in the first embodiment.

As shown in FIG. 2, the component mount wiring portion of the first conductive pattern 30 has annular pattern forming portions 34a, 37a, 38a, 39a, 34b, 37b, 38b, 39b and a coupling portion 36 as described below.

The annular pattern forming portion 39a is connected to the right end of the thin portion 32a, and is inclined so as to extend upward from the right end of the thin portion 32a to one side (above in FIG. 1) in the Y-direction. The annular pattern forming portion 38a extends to one side (above in FIG. 1) in the Y-direction from one end of the annular pattern forming portion 39a (i.e., extends in the Y-direction). The annular pattern forming portion 37a extends rightward from one end of the annular pattern forming portion 38a (i.e., extends in the X-direction). The annular pattern forming portion 34a is arranged on the extension of the annular pattern forming portion 37a with the left first extending portion 13a interposed therebetween, and extends in the X-direction.

The annular pattern forming portion 39b is connected to the left end of the thin portion 32b, and is inclined so as to extend upward from the left end of the thin portion 32b to one side (above in FIG. 1) in the Y-direction. The annular pattern forming portion 38b extends to one side (above in FIG. 1) in the Y-direction from one end of the annular pattern forming portion 39b (i.e., extends in the Y-direction). The annular pattern forming portion 37b extends leftward from one end of the annular pattern forming portion 38b (i.e., extends in the X-direction). The annular pattern forming portion 34b is arranged on the extension of the annular pattern forming portion 37b with the right second extending portion 13b interposed therebetween, and extends in the X-direction.

The annular pattern forming portion 34a is arranged on the extension of the annular pattern forming portion 34b, and vice versa.

The coupling portion 36 extends in the X-direction. More specifically, the left end of the coupling portion 36 is arranged on the extension of a boundary between the annular pattern forming portion 39a and the thin portion 32a with the left first extending portion 13a interposed therebetween. The right end of the coupling portion 36 is arranged on the extension of a boundary between the annular pattern forming portion 39b and the thin portion 32b with the right second extending portion 13b interposed therebetween.

Note that in the present disclosure, the shape of the first conductive pattern 30 including the antenna wiring portion and the component mount wiring portion is not limited to this example.

As shown in FIG. 4, the one surface (upper surface in the case of the present embodiment) of the soluble layer 22 on which the second conductive pattern 40 is formed is, for example, the surface of the soluble layer 22 opposite to the base 11 side.

The soluble layer 22 is arranged, for example, on the upper surface side of the base 11, and a portion of the second conductive pattern 40 corresponding to the soluble layer 22 is arranged on the upper surface of the soluble layer 22.

The soluble layer 22 is arranged over the missing portion 12.

More specifically, the soluble layer 22 includes, for example, a first soluble layer 23a arranged over the first extending portion 13a of the missing portion 12, a second soluble layer 23b arranged over the second extending portion 13b of the missing portion 12, and a third soluble layer 23c arranged over the first extending portion 13a and the second extending portion 13b. Note that in the example shown in FIG. 2, one third soluble layer 23c is arranged over the first extending portion 13a and the second extending portion 13b, but for example, the third soluble layer 23c may be divided into two right and left portions and the portion over the first extending portion 13a and the portion over the second extending portion 13b may be separately arranged.

Both portions of the soluble layer 22 sandwiching the missing portion 12 are bonded to the base 11 and the first conductive pattern 30 through a double-sided tape 24.

The double-sided tape 24 is arranged around the missing portion 12 on the base 11 and the first conductive pattern 30. The other surface (base-11-side surface, second surface) of the soluble layer 22 is bonded to the base 11 and the first conductive pattern 30 through the double-sided tape 24.

Figure 5:
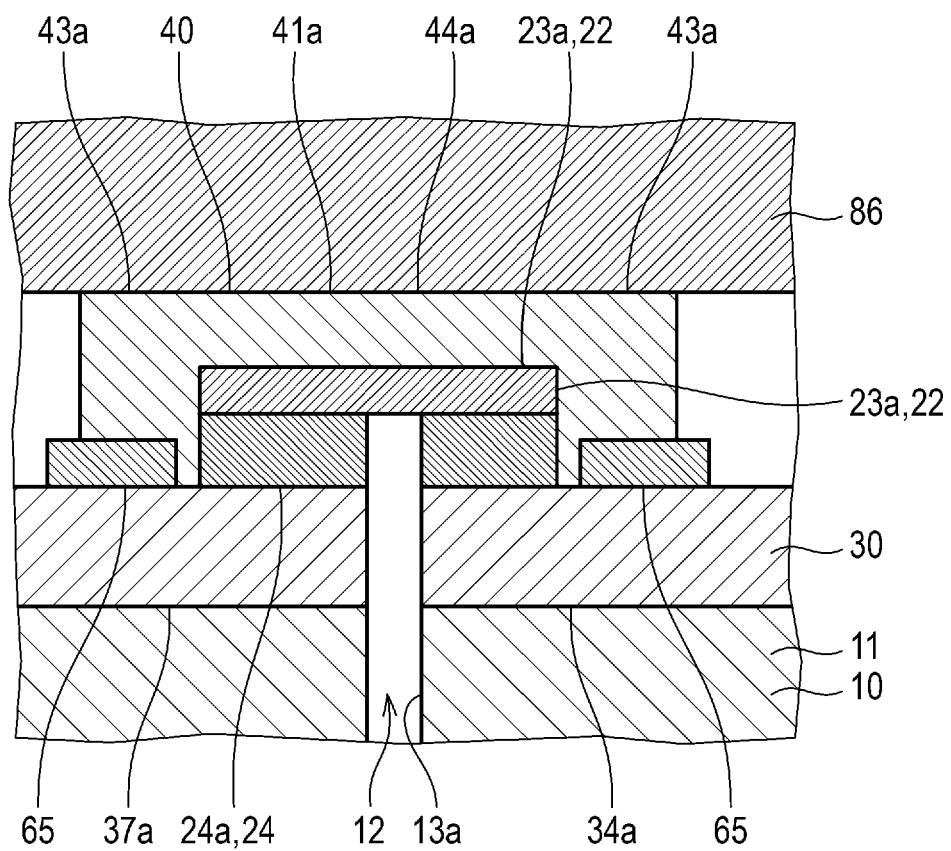
FIG. 5 is an end view showing a first extending portion and the peripheral structure thereof in the first embodiment.

More specifically, as shown in FIGS. 4 and 5, both portions of the first soluble layer 23a sandwiching the first extending portion 13a are bonded to the upper surface of the first conductive pattern 30, for example, through a first double-sided tape 24a.

Both portions of the second soluble layer 23b sandwiching the second extending portion 13b are bonded to the upper surface of the first conductive pattern 30, for example, through a second double-sided tape 24b.

Both portions of the third soluble layer 23c sandwiching the first extending portion 13a and both portions of the third soluble layer 23c sandwiching the second extending portion 13b are bonded to the upper surface of the first conductive pattern 30, for example, through third double-sided tapes (not shown).

In a region where the first extending portion 13a is present, the first double-sided tape 24a is not provided. Similarly, the second double-sided tape 24b is not provided in a region where the second extending portion 13b is present, and the third double-sided tapes are not provided in regions where the first extending portion 13a and the second extending portion 13b are present.

Each of the first soluble layer 23a, the second soluble layer 23b, and the third soluble layer 23c is formed substantially flat along the double-sided tape 24, and is arranged horizontally.

In plan view, the first double-sided tape 24a is arranged in a region included in the first soluble layer 23a, and the second double-sided tape 24b is arranged in a region included in the second soluble layer 23b. Moreover, the third double-sided tapes are arranged in a region included in the third soluble layer 23c.

The soluble layer 22 contains polyvinyl alcohol (PVA), for example. Since the soluble layer 22 contains PVA, a structure of the soluble layer 22 being favorably dissolved when the component mount board 100 contacts moisture can be achieved.

Note that the material of the soluble layer 22 is not limited to PVA and may be, for example, a polyvinylpyrrolidone, water-soluble polyester, or water-soluble paper material or a sheet material derived from a starch component.

Further, in the case of the present embodiment, the soluble layer 22 contains resin having hot melt properties, and is hot-melt joined to the second conductive pattern 40. That is, the soluble layer 22 is fusion-joined to the second conductive pattern 40.

In addition, in the case of the present embodiment, the soluble layer 22 formed in a sheet shape in advance is used. The sheet-shaped soluble layer 22 is arranged over the missing portion 12. Thus, the portion of the second conductive pattern 40 at least over the missing portion 12 can be formed flat along the one surface of the sheet-shaped soluble layer 22.

The thickness dimension of the soluble layer 22 is, but not specifically limited to, preferably 5 μm or more and 50 μm or less and more preferably 10 μm or more and 30 μm or less, for example.

Since the thickness dimension of the soluble layer 22 is 30 μm or less, the soluble layer 22 can be quickly dissolved when contacting liquid.

As shown in FIG. 1, the component mount board 100 has, as the second conductive pattern 40, bridge portions 41a, 41b, 42 extending in the X-direction, for example. That is, the component mount board 100 has multiple second conductive patterns 40 as described above, for example.

As shown in FIG. 2, the bridge portion 41a connects a right end portion of the annular pattern forming portion 37a and a left end portion of the annular pattern forming portion 34a to each other. The bridge portion 41b connects a left end portion of the annular pattern forming portion 37b and a right end portion of the annular pattern forming portion 34b to each other. With this configuration, the annular pattern forming portion 37a, the bridge portion 41a, the annular pattern forming portion 34a, the annular pattern forming portion 34b, the bridge portion 41b, and the annular pattern forming portion 37b connect the first antenna wiring portion and the second antenna wiring portion to each other.

The bridge portion 42 connects the boundary between the annular pattern forming portion 39a and the thin portion 32a and the boundary between the annular pattern forming portion 39b and the thin portion 32b to each other, and extends along the coupling portion 36.

With this configuration, the annular pattern forming portion 37a, the bridge portion 41a, the annular pattern forming portion 34a, the annular pattern forming portion 34b, the bridge portion 41b, the annular pattern forming portion 37b, the annular pattern forming portion 38b, the annular pattern forming portion 39b, the bridge portion 42, the annular pattern forming portion 39a, and the annular pattern forming portion 38a form an annular pattern. The annular pattern is formed, for example, in a substantially annular shape in plan view. The annular pattern is discontinuous between the annular pattern forming portion 34a and the annular pattern forming portion 34b. That is, the annular pattern is in a shape (opened annular shape) having an opening. As shown in, e.g., FIGS. 1 and 2, the mount component 50 is arranged over the annular pattern forming portion 34a and the annular pattern forming portion 34b.

The bridge portion 41a is arranged over the left first extending portion 13a, and is formed on the left first soluble layer 23a. More specifically, the bridge portion 41a extends in the X-direction (direction perpendicular to the first extending portion 13a), and is arranged over the first extending portion 13a in the X-direction. As shown in FIG. 2, both end portions (both end portions in the direction of extension) of the bridge portion 41a are, for example, projecting portions 43a projecting outward from the first soluble layer 23a in plan view. More specifically, a left end portion of the bridge portion 41a projects leftward from the first soluble layer 23a, and a right end portion of the bridge portion 41a projects rightward from the first soluble layer 23a.

An intermediate portion 44a (portion excluding the projecting portions 43a) of the bridge portion 41a is formed on the left first soluble layer 23a.

The bridge portion 41b is arranged over the right second extending portion 13b, and is formed on the right second soluble layer 23b. The bridge portion 41b is formed symmetrical to the bridge portion 41a in the right-left direction, for example. That is, the bridge portion 41b extends in the X-direction (direction perpendicular to the second extending portion 13b), and is arranged over the second extending portion 13b in the X-direction. Both end portions of the bridge portion 41b are, for example, projecting portions 43b projecting outward from the second soluble layer 23b in plan view. An intermediate portion 44b of the bridge portion 41b is formed on the right second soluble layer 23b.

The bridge portion 42 is arranged over the first extending portion 13a and the second extending portion 13b, and is formed on the third soluble layer 23c. More specifically, the bridge portion 42 extends in the X-direction (direction perpendicular to the first extending portion 13a and the second extending portion 13b), and is arranged over the first extending portion 13a and the second extending portion 13b in the X-direction. Both end portions of the bridge portion 42 are, for example, projecting portions 43c projecting outward from the third soluble layer 23c in plan view. An intermediate portion 44c (portion excluding the projecting portions 43c) of the bridge portion 42 is formed on the third soluble layer 23c.

As shown in FIG. 4, the bridge portion 41a is bridged between the annular pattern forming portion 37a and the annular pattern forming portion 34a through the first soluble layer 23a to electrically connect the annular pattern forming portion 37a and the annular pattern forming portion 34a to each other. Similarly, the bridge portion 41b is bridged between the annular pattern forming portion 37b and the annular pattern forming portion 34b through the second soluble layer 23b to electrically connect the annular pattern forming portion 37b and the annular pattern forming portion 34b to each other.

The bridge portion 42 is arranged on the third soluble layer (not shown) bridged between the left first extending portion 13a and the right second extending portion 13b. More specifically, a left end portion of the bridge portion 42 is arranged over the left first extending portion 13a, and a right end portion of the bridge portion 42 is arranged over the right second extending portion 13b.

The left end portion of the bridge portion 42 electrically connects the boundary between the annular pattern forming portion 39a and the thin portion 32a and the left end of the coupling portion 36 to each other, and the right end portion of the bridge portion 42 electrically connects the boundary between the annular pattern forming portion 39b and the thin portion 32b and the right end of the coupling portion 36 to each other.

In the case of the present embodiment, the upper surface of the portion of the second conductive pattern 40 corresponding to the missing portion 12 and the upper surface of a portion adjacent to the portion of the second conductive pattern 40 corresponding to the missing portion 12 are substantially flush with each other. More specifically, the entirety of the upper surface of the above-described intermediate portion 44a to 44c, i.e., the upper surface of the portion of the second conductive pattern 40 over the missing portion 12, is formed substantially flat.

Note that in the present disclosure, a boundary between the upper surface of the portion of the second conductive pattern 40 corresponding to the missing portion 12 and the upper surface of the portion adjacent thereto may be formed with a step.

More specifically, a boundary between the upper surface of a portion of the intermediate portion 44a to 44c corresponding to the missing portion 12 (first extending portion 13a or second extending portion 13b) and the upper surface of a portion adjacent thereto may be formed with a step.

In this case, the height dimension of the step at the boundary between the upper surface of the portion of the intermediate portion 44a to 44c corresponding to the missing portion 12 (first extending portion 13a or second extending portion 13b) and the upper surface of the portion adjacent thereto is preferably 10 µm or more and 100 µm or less.

In the case of the present embodiment, the upper surface of a portion of the second conductive pattern 40 formed on the one surface of the soluble layer 22 and the upper surface of a portion adjacent thereto are substantially flush with each other.

More specifically, at the bridge portion 41a, 41b, 42, the upper surface of the projecting portion 43a, 43b, 43c and the upper surface of the intermediate portion 44a, 44b, 44c are substantially flush with each other. That is, the entirety of the upper surface of the bridge portion 41a, 41b, 42 is substantially flat.

Note that in the present disclosure, a boundary between the upper surface of the portion of the second conductive pattern 40 corresponding to the soluble layer 22 and the upper surface of the portion adjacent thereto may be formed with a step.

More specifically, a boundary between the upper surface of the projecting portion 43a, 43b, 43c and the upper surface of the intermediate portion 44a, 44b, 44c at the bridge portion 41a, 41b, 42 may be formed with a step.

In this case, the height dimension of the step at the boundary between the upper surface of the projecting portion 43a and the upper surface of the intermediate portion 44a (between the upper surface of the projecting portion 43b, 43c and the upper surface of the intermediate portion 44b, 44c) is preferably 10 µm or more and 100 µm or less.

As described above, the second conductive pattern 40 (bridge portions 41a, 41b, 42) is arranged corresponding to the first extending portion 13a and the second extending portion 13b of the missing portion 12. The second conductive pattern 40 is arranged over the missing portion 12 (first extending portion 13a and second extending portion 13b), and is bridged between a first portion of the first conductive pattern 30 and a second portion which is a portion of the first conductive pattern 30 separated from the first portion through the missing portion 12 to electrically connect the first and second portions of the first conductive pattern 30 to each other. That is, each second conductive pattern 40 is a bridge wiring.

Note that the component mount board 100 may have, as the second conductive pattern 40, a portion other than the above-described bridge portions 41a to 42. Note that the bridge portions 41a to 42 are wiring portions forming the circuit 60.

That is, the portion (bridge portions 41a to 42) of the second conductive pattern 40 corresponding to the missing portion 12 is a wiring portion forming the circuit 60, and is not, e.g., an electrode.

The second conductive pattern 40 (each of the bridge portions 41a, 41b, 42) is preferably formed thicker than a portion (annular pattern forming portions 34a, 34b, 37a, 37b, 39a, 39b) of the first conductive pattern 30 connected to the second conductive pattern 40. In a case where the first conductive pattern 30 is, for example, a pattern derived from metal foil and the impedance thereof is low, if the second conductive pattern 40 is a coating film formed by printing, the impedance of the second conductive pattern 40 is expected to be a higher value than the impedance of the first conductive pattern 30 made of metal foil. However, the second conductive pattern 40 is formed thicker than the portion of the first conductive pattern 30 connected to the second conductive pattern 40 as described above, and it is advantageous because impedance matching between the first conductive pattern 30 and the second conductive pattern 40 can be made in a low impedance state.

Note that the second conductive pattern 40 may be formed with the same width as that of the portion of the first conductive pattern 30 connected to the second conductive pattern 40 or be formed thinner than such a portion.

The length of the second conductive pattern 40 is preferably longer than the width dimension of the portion (annular pattern forming portions 34a, 34b, 37a, 37b, 39a, 39b, thin portions 32a, 32b, coupling portion 36) of the first conductive pattern 30 connected to the second conductive pattern 40, more preferably a length twice as long as the width dimension or more, and much more preferably a length three times as long as the width dimension or more.

Specifically, the length (bridge length) of a portion of the second conductive pattern 40 bridged over the first conductive pattern 30 (between the first portion and the second portion) is preferably longer than the width dimension of the portion of the first conductive pattern 30 connected to the second conductive pattern 40, more preferably a length twice as long as the width dimension or more, and much more preferably a length three times as long as the width dimension or more.

In the case of the present embodiment, the second conductive pattern 40 contains resin having hot melt properties. The second conductive pattern 40 is hot-melt joined to the first conductive pattern 30, and accordingly, is electrically and mechanically connected to the first conductive pattern 30. That is, the second conductive pattern 40 is fusion-joined to the first conductive pattern 30, and the second conductive pattern 40 and the first conductive pattern 30 do not merely contact each other.

The second conductive pattern 40 is, for example, a coating film containing a conductive filler and a binder containing thermoplastic resin. As the thermoplastic resin, one exhibiting hot melt properties at 50° C. or more is preferable.

The second conductive pattern 40 is made, for example, of water-soluble conductive paste, and as one example, is a water-soluble silver pattern.

More specifically, the second conductive pattern 40 is made, for example, of a dry material obtained in such a manner that conductive particles (e.g., silver particles) are knead, using an organic solvent, with thermoplastic resin. The second conductive pattern 40 is, for example, a printed coating film.

The thickness dimension of the second conductive pattern 40 is, but not specifically limited to, preferably 10 µm or more and 50 µm or less, for example. Since the thickness dimension of the second conductive pattern 40 is 10 µm or more, the stable properties of the circuit 60 can be obtained at a stage before contact of the component mount board 100 with liquid. Since the thickness dimension of the second conductive pattern 40 is 50 µm or less, the second conductive pattern 40 can be quickly dissolved or weakened when the component mount board 100 contacts liquid.

In the case of the present embodiment, the second conductive patterns 40 as the bridge wirings are arranged at multiple locations on the circuit 60. Thus, a probability of any of the second conductive patterns 40 being broken, cracked, or dissolved or weakened upon contact of the component mount board 100 with liquid can be increased.

In the case of the present embodiment, the base 11 is not soluble in liquid. Thus, even when the component mount board 100 accidentally contacts liquid upon, e.g., storage, a probability of the properties of the circuit 60 being changed due to breakage or cracking of the first conductive pattern 30 by dissolving of the base 11 can be reduced.

The base 11 insoluble in liquid may be made of paper or a resin film, for example. Examples of a resin material forming the resin film may include, but not specifically limited to, polyethylene, polystyrene, polypropylene, and polyester. Note that the present disclosure is not limited to this example and the base 11 may be soluble in liquid.

The thickness dimension of the base 11 is, but not specifically limited to, preferably 10 µm or more and 75 µm or less, for example. Since the thickness dimension of the base 11 is 10 µm or more, the base 11 can stably support the first conductive pattern 30 and the structural strength of the component mount board 100 can be sufficiently obtained.

Since the thickness dimension of the base 11 is 75 µm or less, favorable flexibility of the component mount board 100 is obtained.

In the case of the present embodiment, the first conductive pattern 30 is also not soluble in liquid. Thus, a probability of the properties of the circuit 60 being changed due to dissolving of the first conductive pattern 30 can be reduced even when the component mount board 100 accidentally contacts liquid upon, e.g., storage. Specifically, over the half of the circuit 60 is preferably formed by the first conductive pattern 30 insoluble in liquid.

Note that the present disclosure is not limited to this example and the first conductive pattern 30 may be soluble in liquid.

The first conductive pattern 30 is, for example, made of metal foil. More specifically, the first conductive pattern 30 is formed by etching of metal foil. Examples of the metal material may include aluminum, gold, silver, and copper.

Note that the first conductive pattern 30 may be a printed coating film, for example.

In a case where the first conductive pattern 30 is formed by printing, the first conductive pattern 30 is, for example, a coating film containing a conductive filler and a binder containing thermoplastic resin. Examples of the conductive filler may include gold, silver, copper, and carbon. Examples of the thermoplastic resin may include polyester resin, acrylic resin, and urethane resin.

The thickness dimension of the first conductive pattern 30 is, but not specifically limited to, preferably 5 µm or more and 30 µm or less, for example.

As described above, both end portions of the second conductive pattern 40 (bridge portions 41a, 41b) are, for example, the projecting portions 43a, 43b projecting outward from the soluble layer 22 in plan view. The projecting portions 43a, 43b are electrically connected to the first conductive pattern 30 through conductive paste or a conductive adhesive. In the present embodiment, the projecting portions 43a, 43b are electrically connected to the first conductive pattern 30 through conductive paste 65, as one example.

According to this configuration, the second conductive pattern 40 can be favorably electrically connected to the first conductive pattern 30.

More specifically, in the case of the present embodiment, when the conductive paste 65 is provided, thermal treatment is performed on the conductive paste 65 after printing of the conductive paste 65. In a case where the first conductive pattern 30 is made of aluminum, an aluminum oxide film (not shown) is formed on the surface of the first conductive pattern 30 in some cases.

According to the present embodiment, upon the thermal treatment on the conductive paste 65, stress is generated due to contraction of thermosetting resin contained in the conductive paste 65 in a region, where the conductive paste 65 is provided, on the surface of the first conductive pattern 30. Thus, the above-described aluminum oxide film can be broken in the region where the conductive paste 65 is formed. As a result, the second conductive pattern 40 can be favorably electrically connected to the first conductive pattern 30 through the conductive paste 65.

In the case of the present embodiment, the projecting portions 43a, 43b are electrically connected to the first conductive pattern 30 through the conductive paste 65, as one example. The conductive paste 65 is provided, for example, on the upper surface of the first conductive pattern 30.

The conductive paste 65 contains, for example, conductive particles with a particle size of 1 μm or more and 5 μm or less and thermosetting resin. As one example, the conductive particle is a silver particle or a particle formed such that the surface of a core made of silica is coated with silver.

The thickness dimension of the conductive paste 65 is, but not specifically limited to, preferably the substantially same dimension as the thickness dimension of the soluble layer 22. That is, the thickness dimension of the conductive paste 65 is, for example, preferably 5 μm or more and 50 μm or less and more preferably 10 μm or more and 30 μm or less.

Although not shown in detail, the mount component 50 includes, for example, a component body having an element inside by resin molding and a mount terminal provided along the lower surface of the component body. The element and the mount terminal are electrically connected to each other in the resin-molded body.

The number of mount terminals included in the mount component 50 is not specifically limited. In the case of the present embodiment, the mount component 50 includes two mount terminals, and each mount terminal is electrically connected to the first conductive pattern 30. More specifically, one mount terminal of the mount component 50 is electrically connected to a right end portion of the annular pattern forming portion 34a, and the other mount terminal of the mount component 50 is electrically connected to a left end portion of the annular pattern forming portion 34b. That is, the mount component 50 is arranged over the annular pattern forming portion 34a and the annular pattern forming portion 34b.

As described above, the mount component 50 is mounted on the component mount wiring portion.

The antenna wiring portion exchanges a signal with not-shown external equipment (e.g., RFID reader/writer), for example. A signal or radio wave received from the external equipment by the antenna wiring portion is input to the mount component 50. The mount component 50 transmits a signal to the external equipment via the component mount wiring portion and the antenna wiring portion. Note that in some cases, part or the entirety of the component mount wiring portion may function as an antenna in cooperation with the antenna wiring portion.

The mount component 50 is, for example, of a passive type to be operated with power excited from the external equipment via the antenna wiring portion.

In the case of the present embodiment, the communication function of the component mount board 100 is eliminated or degraded by dissolving, breakage, or cracking of the second conductive pattern 40 due to contact of the component mount board 100 with liquid. Elimination or degradation of the communication function is detected by the external equipment so that contact of the component mount board 100 with liquid can be sensed.

As shown in, e.g., FIG. 4, the component mount board 100 further includes a water-absorption expansion material 70.

When expanding by water absorption, the water-absorption expansion material 70 presses the base 11 or the second conductive pattern 40 in the direction perpendicular to the plane of the base 11, thereby breaking the second conductive pattern 40.

Accordingly, external force is applied to the second conductive pattern 40, and therefore, the second conductive pattern 40 is broken. The state of the component mount board 100 being soaked in liquid can be more reliably sensed in such a manner that occurrence of breakage of the second conductive pattern 40 is indirectly detected by detection of the change in the properties of the circuit 60 (mainly loss of the function of the circuit 60).

In the case of the present embodiment, the water-absorption expansion material 70 is arranged on the opposite side (lower surface side of the base 11) of the base 11 from the second conductive pattern 40, as shown in FIGS. 4 and 7. When expanding by water absorption, the water-absorption expansion material 70 presses the base 11 in the direction perpendicular to the plane of the base 11, thereby breaking the second conductive pattern 40.

The water-absorption expansion material 70 is formed, for example, in a sheet shape, and is arranged along the lower surface of the base 11.

As shown in FIG. 2, in plan view, the water-absorption expansion material 70 is formed, for example, in a substantially rectangular shape elongated in the Y-direction. Note that in FIG. 2, the water-absorption expansion material 70 is indicated by a chain double-dashed line.

The water-absorption expansion material 70 is arranged, for example, at a position corresponding to a portion of the base 11 located between the first extending portion 13a and the second extending portion 13b. In the case of the present embodiment, the "portion of the base 11 located between the first extending portion 13a and the second extending portion 13b" is, for example, a portion of the base 11 located between the right edge of the first extending portion 13a and the left edge of the second extending portion 13b.

According to this configuration, the bridge portions 41a, 41b, 42 connecting the first antenna wiring portion and the second antenna wiring portion to each other can be easily broken by the water-absorption expansion material 70 expanded by water absorption. Thus, the state of the component mount board 100 being soaked in liquid can be more reliably detected.

Note that in the present disclosure, the component mount board 100 is only required to be configured such that the water-absorption expansion material 70 expanded by water absorption breaks at least one of the bridge portion 41a or the bridge portion 41b. That is, in the present disclosure, the water-absorption expansion material 70 is only required to be arranged at least in a region including the bridge portion 41a or the bridge portion 41b in plan view, and for example, the outer edge of the water-absorption expansion material 70 may be located in a region overlapping with the missing portion 12 beyond the portion of the base 11 located between the first extending portion 13a and the second extending portion 13b in plan view.

The water-absorption expansion material 70 is, as one example, a compressed cellulose sponge. Note that the present disclosure is not limited to this example. The water-absorption expansion material 70 may be, for example, a member expandable by water absorption other than the compressed cellulose sponge, such as water absorbing polymer.

As shown in FIG. 4, the component mount board 100 further includes the first water-conducting sheet 85. The first water-conducting sheet 85 is arranged on the lower surface side of the base 11 so as to overlap with the base 11 through the water-absorption expansion material 70.

With this configuration, the first water-conducting sheet 85 can absorb liquid (e.g., water), and therefore, the liquid can be sufficiently supplied to the water-absorption expansion material 70.

The first water-conducting sheet 85 is preferably arranged at least in a region including the water-absorption expansion material 70 in plan view. The first water-conducting sheet 85 may be arranged across the entire surface of the component mount board 100, or be selectively arranged in a partial region of the component mount board 100. In the present embodiment, the first water-conducting sheet 85 is arranged, as one example, in a region including the entirety of the first conductive pattern 30 in plan view.

The component mount board 100 further includes the second water-conducting sheet 86. The second water-conducting sheet 86 is arranged on the opposite side (upper surface side of the base 11) of the water-absorption expansion material 70 and the board 10 from the first water-conducting sheet 85. In the present embodiment, the second water-conducting sheet 86 is arranged along the upper surface of the second conductive pattern 40.

With this configuration, the second water-conducting sheet 86 can absorb liquid (e.g., water), and therefore, the liquid can be sufficiently supplied to the soluble layer 22 and the second conductive pattern 40.

The second water-conducting sheet 86 is preferably arranged at least in a region including the soluble layer 22 and the second conductive pattern 40 in plan view. The second water-conducting sheet 86 may be arranged across the entire surface of the component mount board 100, or be selectively arranged in a partial region of the component mount board 100. In the present embodiment, the second water-conducting sheet 86 is arranged, as one example, in a region including the entirety of the first conductive pattern 30 in plan view.

As shown in FIG. 4, the first water-conducting sheet 85 and the base 11 are joined to each other at a position outside the region where the first extending portion 13a and the second extending portion 13b are arranged, in plan view.

With this configuration, when expanding by water absorption, the water-absorption expansion material 70 can expand mainly in the direction perpendicular to the plane.

In the case of the present embodiment, a portion of the base 11 on the opposite side (opposite side in the planar direction of the base 11) of the missing portion 12 from the water-absorption expansion material 70 side is joined to the first water-conducting sheet 85 at a first joint portion 91. More specifically, a left portion of the base 11 with respect to the first extending portion 13a and a right portion of the base 11 with respect to the second extending portion 13b are joined to the upper surface of the first water-conducting sheet 85 at the first joint portions 91. In the case of the present embodiment, the first joint portion 91 is a double-sided tape, as one example. Note that in the present disclosure, a method for joining the first water-conducting sheet 85 and the base 11 to each other is not specifically limited and, e.g., an adhesive or welding may be used other than the double-sided tape as necessary according to the properties of the materials of the first water-conducting sheet 85 and the base 11.

A separation distance D (see FIG. 7) between the first joint portion 91 and the water-absorption expansion material 70 in the X-direction is preferably twice as long as the thickness dimension TA of the expanded water-absorption expansion material 70 or more, for example. More specifically, in a case where the thickness dimension TA of the expanded water-absorption expansion material 70 is, for example, 10 mm, the separation distance D between the first joint portion 91 and the water-absorption expansion material 70 is 20 mm.

As shown in FIG. 4, the first water-conducting sheet 85 and the second water-conducting sheet 86 are joined to each other, for example, at a position outside a region where the board 10 is arranged, in plan view.

In the case of the present embodiment, a left end portion of the second water-conducting sheet 86 and a right end portion of the second water-conducting sheet 86 are joined to the upper surface of the first water-conducting sheet 85 at second joint portions 93.

In the case of the present embodiment, the second joint portion 93 is a double-sided tape, as one example. Note that in the present disclosure, a method for joining the first water-conducting sheet 85 and the second water-conducting sheet 86 to each other is not specifically limited and, e.g., an adhesive or welding may be used other than the double-sided tape as necessary according to the properties of the materials of the first water-conducting sheet 85 and the second water-conducting sheet 86.

When the first water-conducting sheet 85 and the second water-conducting sheet 86 are joined to each other, the board 10 may also be joined to the first water-conducting sheet 85 and the second water-conducting sheet 86.

Further, in a portion of the base 11 other than a region where the first conductive pattern 30 is formed, a second missing portion 77 penetrating the base 11 and causing the first water-conducting sheet 85 side and the second water-conducting sheet 86 side to communicate with each other is formed.

According to this configuration, liquid can be favorably communicated between the first water-conducting sheet 85 and the second water-conducting sheet 86.

In the case of the present embodiment, the second missing portions 77 are formed, for example, in a left portion of the base 11 with respect to the first extending portion 13a and a right portion of the base 11 with respect to the second extending portion 13b.

As shown in FIG. 1, the planar shape of the second missing portion 77 is, but not specifically limited to, a circular shape, for example.

The diameter dimension of the second missing portion 77 is, for example, preferably 0.1 mm or more and 10 mm or less and more preferably 1.0 mm or more and 5.0 mm or less. In the case of the present embodiment, the diameter dimension of the second missing portion 77 is about 3.0 mm, as one example.

Note that in the present disclosure, the first water-conducting sheet 85 and the second water-conducting sheet 86 may be connected to each other through the second missing portion 77, for example. That is, the above-described second joint portions 93 may be formed at positions corresponding to the second missing portions 77 at the first water-conducting sheet 85 and the second water-conducting sheet 86.

The component mount board 100 includes, for example, a first restraining sheet (later-described first water permeable sheet 87 in the case of the present embodiment) arranged on the upper surface side of the base 11 and a second restraining sheet (later-described second water permeable sheet 88 in the case of the present embodiment) arranged on the lower surface side of the base 11. The first restraining sheet and the second restraining sheet restrain at least the periphery of a region, where the second conductive pattern 40 is arranged, of the board 10. In the case of the present embodiment, as one example, the first restraining sheet and the second restraining sheet restrain at least the periphery of a region, where the first conductive pattern 30 is arranged, of the board 10.

Note that the periphery of the region where the second conductive pattern 40 is arranged is the periphery of a region including the entirety of the missing portion 12 (first missing portion).

More specifically, in the case of the present embodiment, the base 11 includes, as shown in FIG. 1, a body portion 111a formed elongated in the X-direction and having a substantially rectangular shape in plan view and multiple fixing pieces 111b protruding outward from the peripheral edge of the body portion 111a and arranged at intervals, for example.

Part of the first restraining sheet is directly or indirectly fixed to one surface of each of the multiple fixing pieces 111b, and part of the second restraining sheet is directly or indirectly joined to the other surface of each of the multiple fixing pieces 111b. The first restraining sheet and the second restraining sheet are directly or indirectly joined to each other without the fixing piece 111b between adjacent ones of the multiple fixing pieces 111b in the planar direction of the base 11.

With this configuration, the peripheral edge portion of the board 10 is restrained by the first restraining sheet and the second restraining sheet.

The multiple fixing pieces 111b includes those arranged with the body portion 111a interposed therebetween in the X-direction and those arranged with the body portion 111a interposed therebetween in the Y-direction. Thus, the base 11 can be restrained by the first restraining sheet and the second restraining sheet at both end portions of the base 11 in the X-direction and both end portions of the base 11 in the Y-direction.

In the case of the present embodiment, the component mount board 100 includes, for example, the first water permeable sheet 87 as the first restraining sheet and the second water permeable sheet 88 as the second restraining sheet. Note that in FIG. 1, each of the first water permeable sheet 87 and the second water permeable sheet 88 is indicated by a chain double-dashed line.

With this configuration, the first water permeable sheet 87 or the second water permeable sheet 88 can quickly supply liquid to the water-absorption expansion material 70. More specifically, the first water permeable sheet 87 or the second water permeable sheet 88 can quickly supply liquid to the water-absorption expansion material 70 both in a case where the surface of the component mount board 100 on the side on which the first water permeable sheet 87 is arranged is mainly soaked in liquid and a case where the surface of the component mount board 100 on the side on which the second water permeable sheet 88 is arranged is mainly soaked in liquid.

More specifically, in the case of the present embodiment, the second water-conducting sheet 86, the board 10, the water-absorption expansion material 70, and the first water-conducting sheet 85 are arranged in this order from above between the first water permeable sheet 87 and the second water permeable sheet 88, as shown in FIG. 4.

Further, a double-sided tape 75 is arranged between the lower surface (lower surface of the base 11) of the board 10 and the upper surface of the water-absorption expansion material 70. With this configuration, the water-absorption expansion material 70 is fixed to between the lower surface of the board 10 and the upper surface of the first water-conducting sheet 85.

In the case of the present embodiment, the outer shape of the first water permeable sheet 87 and the outer shape of the second water permeable sheet 88 are the same as each other, and are coincident with each other in plan view, for example.

Moreover, part of a peripheral edge portion of the first water permeable sheet 87 and part of a peripheral edge portion of the second water permeable sheet 88 are joined (e.g., thermocompressed) to each other. More specifically, the peripheral edge portion of the first water permeable sheet 87 and the peripheral edge portion of the second water permeable sheet 88 are directly joined to each other without the fixing piece 111b between adjacent ones of the multiple fixing pieces 111b in the planar direction of the base 11. Portions of the peripheral edge portion of the first water permeable sheet 87 corresponding to the multiple fixing pieces 111b are joined to one surface of each of these fixing pieces 111b, and portions of the peripheral edge portion of the second water permeable sheet 88 corresponding to the multiple fixing pieces 111b are joined to the other surface of each of these fixing pieces 111b.

In this manner, the peripheral edge portion of the board 10 is restrained by the first water permeable sheet 87 and the second water permeable sheet 88.

Each of the first water-conducting sheet 85 and the second water-conducting sheet 86 is, but not specifically limited to, high water-absorption (water-holding) rayon non-woven fabric as one example, and the basis weight thereof is, for example, 40 g/m2 or more and 80 g/m2 or less and preferably 50 g/m2 or more and 70 g/m2 or less. Note that each of the first water-conducting sheet 85 and the second water-conducting sheet 86 may be, for example, pulp, cotton, or hemp.

Each of the first water permeable sheet 87 and the second water permeable sheet 88 is, but not specifically limited to, non-woven fabric made of polyester, polypropylene, or polyethylene terephthalate and having a basis weight of 5 g/m2 or more and 100 g/m2 or less and preferably 10 g/m2 or more and 50 g/m2 or less, as one example. With this configuration, the water permeability of each of the first water permeable sheet 87 and the second water permeable sheet 88 can be favorably ensured.

Hereinafter, one example of operation when the water-absorption expansion material 70 expanded by water absorption presses the base 11 or the second conductive pattern 40 in the direction perpendicular to the plane of the base 11 to break the second conductive pattern 40 will be described.

As shown in FIG. 7, when the component mount board 100 is soaked in liquid, the water-absorption expansion material 70 expands by absorbing the liquid. Note that at this time, the soluble layer 22 may be fully dissolved by contact with the liquid or be only partially dissolved. In the example shown in FIG. 7, a portion of the soluble layer 22 corresponding to the water-absorption expansion material 70 maintains its shape without being dissolved.

The expanded water-absorption expansion material 70 presses the portion of the base 11 located between the first extending portion 13a and the second extending portion 13b and a portion of the second conductive pattern 40 located between the first extending portion 13a and the second extending portion 13b in the direction (above in FIG. 7 in the case of the present embodiment) perpendicular to the plane of the base 11. Accordingly, two portions of the base 11 sandwiching the missing portion 12 are displaced relative to each other.

More specifically, as described above, the first water-conducting sheet 85 and the base 11 are joined to each other at the first joint portions 91 at the positions outside the region where the first extending portion 13a and the second extending portion 13b are arranged, in plan view. Moreover, the second water-conducting sheet 86 and the first water-conducting sheet 85 are joined to each other at the second joint portions 93 at the positions outside the region where the board 10 is arranged, in plan view.

Thus, a portion of the base 11 located between the right edge of the first extending portion 13a and the left edge of the second extending portion 13b is upwardly displaced as compared to a left portion of the base 11 with respect to the left edge of the first extending portion 13a and a right portion of the base 11 with respect to the right edge of the second extending portion 13b. Moreover, a right portion of the bridge portion 41a with respect to the first extending portion 13a is displaced upward as compared to a left portion of the bridge portion 41a with respect to the first extending portion 13a. Similarly, a left portion of the bridge portion 41b with respect to the second extending portion 13b is displaced upward as compared to a right portion of the bridge portion 41b with respect to the second extending portion 13b. A portion of the bridge portion 42 located between the right edge of the first extending portion 13a and the left edge of the second extending portion 13b is displaced upward as compared to a left portion of the bridge portion 42 with respect to the left edge of the first extending portion 13a and a right portion of the bridge portion 42 with respect to the right edge of the second extending portion 13b.

Accordingly, the bridge portion 41a bridged over the first extending portion 13a, the bridge portion 41b bridged over the second extending portion 13b, and the bridge portion 42 bridged over the left edge of the first extending portion 13a and the right edge of the second extending portion 13b are broken.

The component mount board 100 according to the present embodiment is attached, as one example, to a water absorbing product (e.g., paper diaper 300 shown in FIGS. 4 and 6) capable of absorbing liquid with a double-sided tape 99.

When a wearer urinates in the paper diaper 300, a state of the second conductive pattern 40 or the soluble layer 22 being dissolved in the urine is sensed so that urination of the wearer can be sensed. That is, the component mount board 100 is utilized as a urination sensor that notifies a carer of the timing of replacement of the paper diaper 300.

Note that the water absorbing product to which the component mount board 100 is attached is not limited to the paper diaper 300, and for example, may be a urine pad (not shown) attached to underwear.

First Modification of First Embodiment

Next, a first modification of the first embodiment will be described with reference to FIGS. 8 and 9. Note that in FIGS. 8 and 9, the thickness of each layer is schematically shown thick for the sake of convenience in easy understanding of the layer structure of the component mount board 100.

The component mount board 100 according to the present modification is different from the component mount board 100 according to the first embodiment in the following points, and on the other points, is configured similarly to the component mount board 100 according to the first embodiment.

Figure 8:
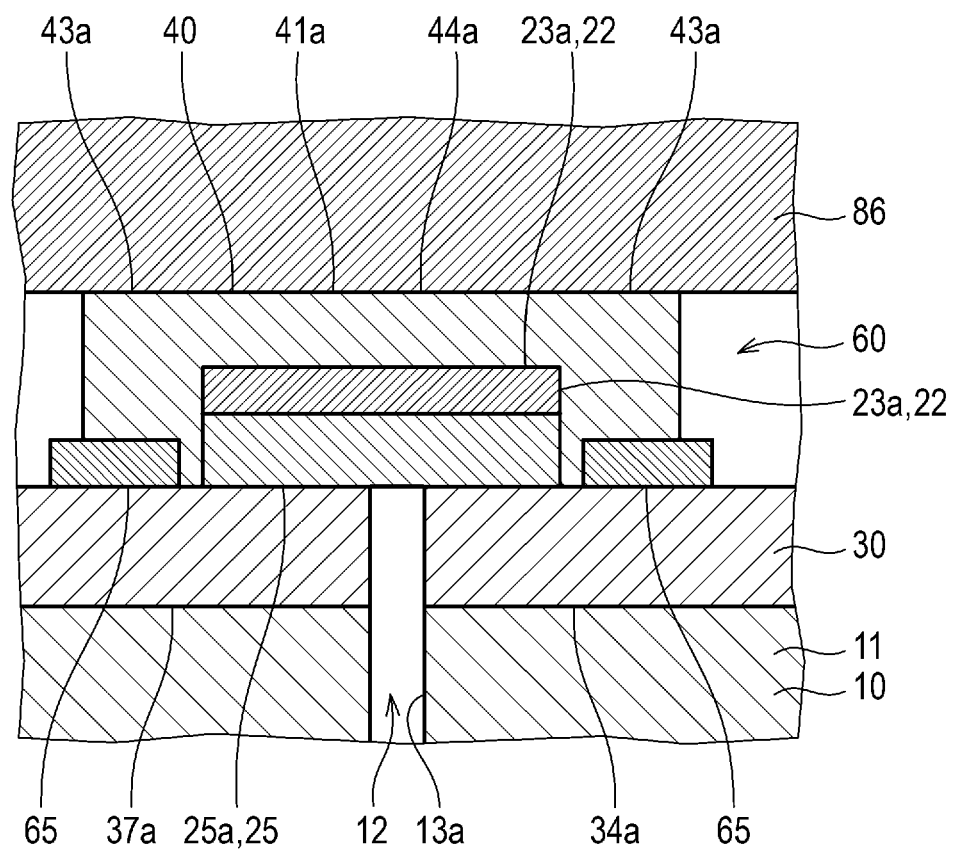
FIG. 8 is an end view showing a first extending portion and the peripheral structure thereof in a first modification of the first embodiment.

As shown in FIG. 8, in the case of the present modification, the component mount board 100 has an adhesive layer 25 instead of the double-sided tape 24. The adhesive layer 25 is arranged on the base 11 and the first conductive pattern 30 over the missing portion 12, and is soluble in liquid. The soluble layer 22 is formed on the adhesive layer 25. The other surface (base-11-side surface, second surface) of the soluble layer 22 is bonded to the base 11 and the first conductive pattern 30 with the adhesive layer 25.

With this configuration, the soluble layer 22 can also be favorably joined to the base 11.

More specifically, in the case of the present modification, the adhesive layer 25 includes a first adhesive layer 25a arranged over the first extending portion 13a and a second adhesive layer (not shown) arranged over the second extending portion 13b.

The first soluble layer 23a of the soluble layer 22 is directly stacked on the upper surface of the first adhesive layer 25a, and the second soluble layer 23b of the soluble layer 22 is directly stacked on the upper surface of the second adhesive layer.

The adhesive layer 25 is made, for example, of water-soluble (or aqueous) adhesive. The adhesive forming the adhesive layer 25 includes, but not specifically limited to, starch paste, acacia paste, and aqueous acrylic emulsion. As an example, the aqueous acrylic emulsion is formed in such a manner that acrylic monomer containing a carboxyl group is copolymerized and alcohol and polyethylene oxide are added thereto. The adhesive layer 25 may contain two or more types of water-soluble (or aqueous) adhesives. Of the above-described examples, the aqueous acrylic emulsion is applied as one example of the water-soluble adhesive according to the present disclosure.

The thickness of the second conductive pattern 40 is preferably twice as great as the thickness of the soluble layer 22 or more. Note that the "thickness of the second conductive pattern 40" described herein means the average of the thickness of the entire second conductive pattern 40.

With this configuration, formation of the step at the boundary between the portion of the second conductive pattern 40 corresponding to the soluble layer 22 and the portion adjacent thereto can be reduced. Thus, the structural strength of the second conductive pattern 40 can be sufficiently ensured.

Figure 9:
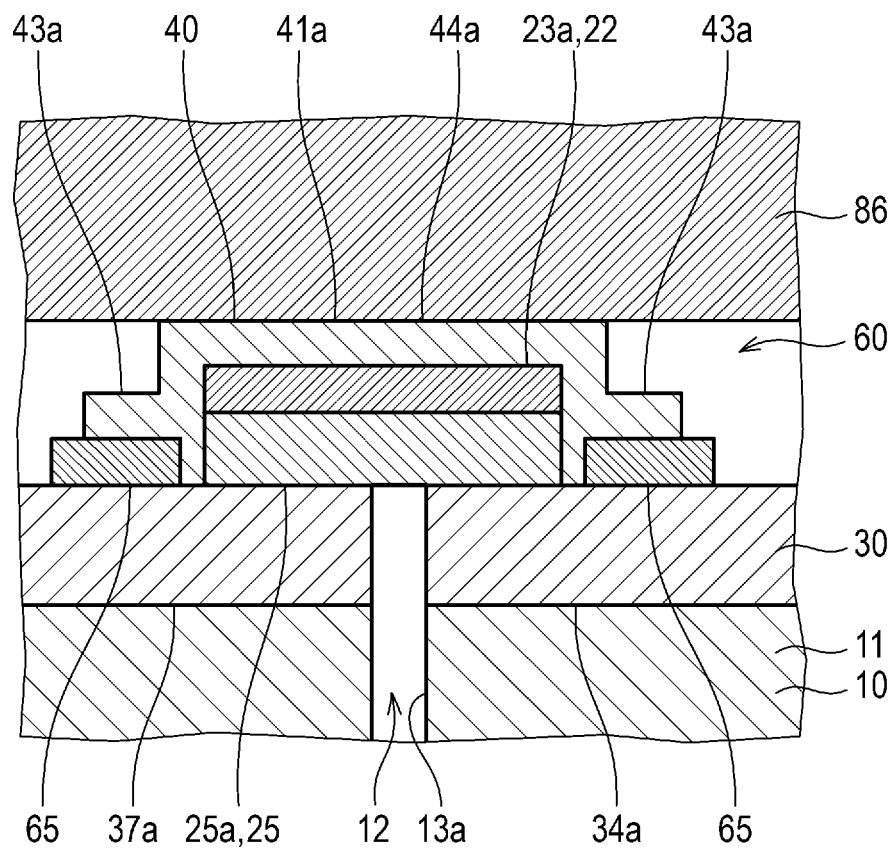
FIG. 9 is an end view showing the first extending portion and the peripheral structure thereof in the first modification of the first embodiment, FIG. 9 showing an example where a second conductive pattern is formed with a step.

More specifically, in a case where the thickness of the second conductive pattern 40 is less than twice as great as the thickness of the soluble layer 22, the step may be formed at the boundary between the portion (e.g., the intermediate portion 44a, 44b, 44c) of the second conductive pattern 40 corresponding to the soluble layer 22 and the portion (projecting portion 43a, 43b, 43c) adjacent thereto as shown in FIG. 9.

However, the thickness of the second conductive pattern 40 is twice as great as the thickness of the soluble layer 22 or more as shown in FIG. 8 so that the portion (the same as above) of the second conductive pattern 40 corresponding to the soluble layer 22 and the portion (the same as above) adjacent thereto can be substantially flush with each other.

Second Modification of First Embodiment

Next, a second modification of the first embodiment will be described with reference to FIGS. 10 and 11. Note that in FIG. 11, the first conductive pattern 30 and the missing portion 12 are selectively shown and other portions are not shown.

The component mount board 100 according to the present modification is different from the component mount board 100 according to the first embodiment in the following points, and on the other points, is configured similarly to the component mount board 100 according to the first embodiment.

Figure 10:
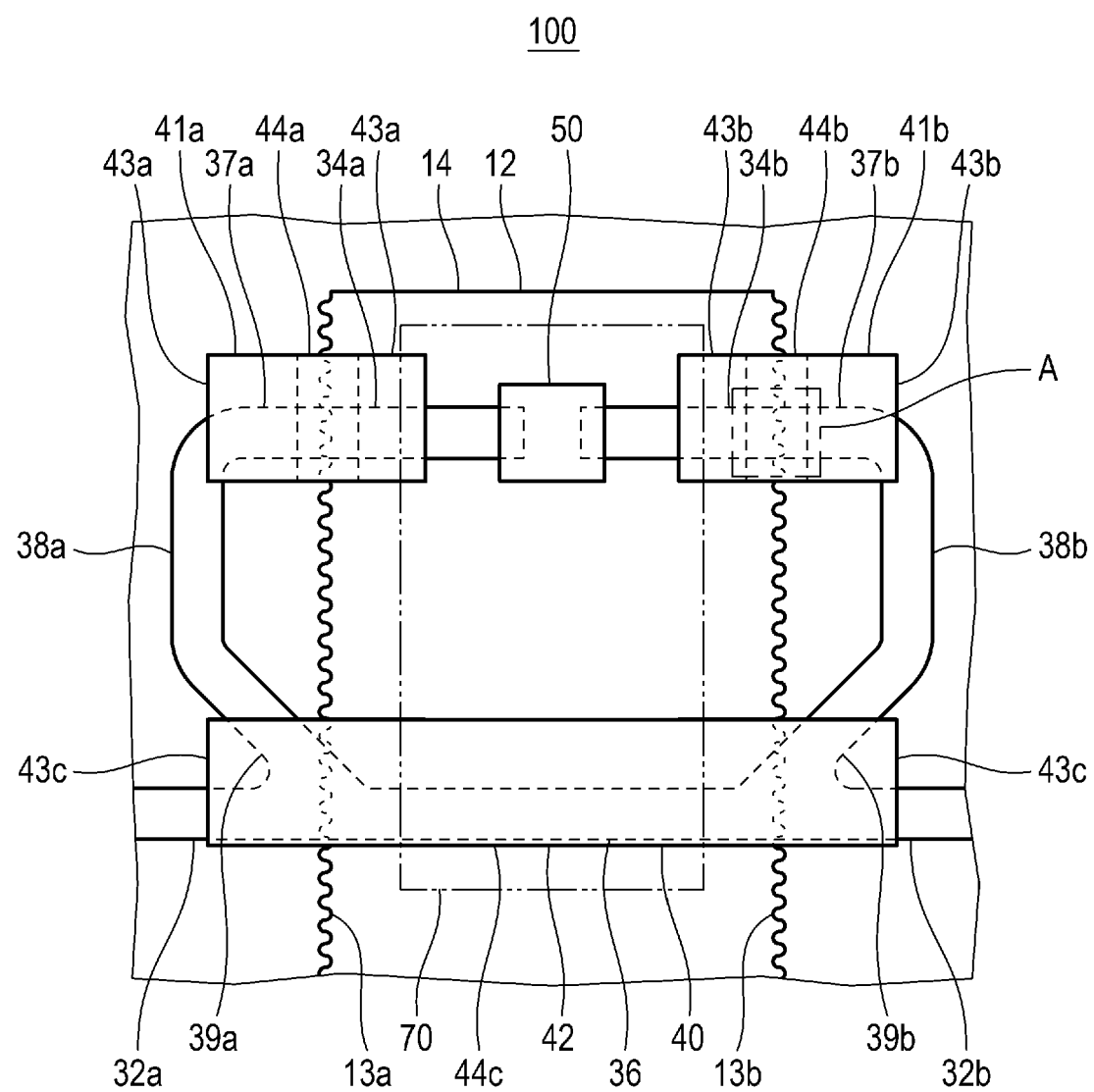
FIG. 10 is a plan view showing a missing portion and the peripheral structure thereof in a second modification of the first embodiment.
Figure 11:
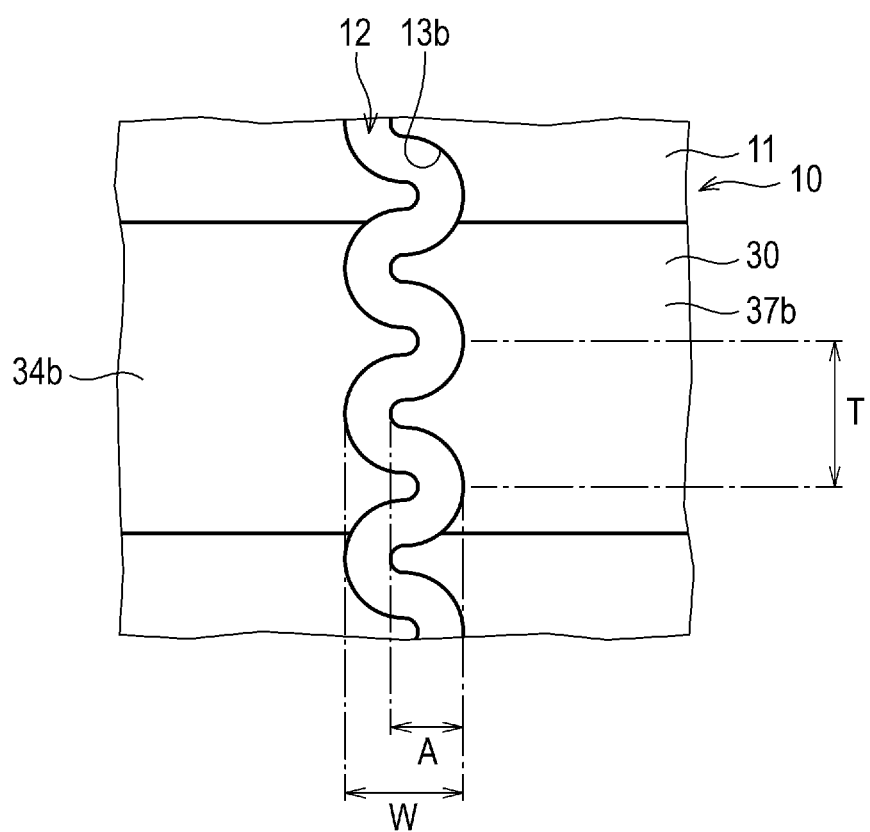
FIG. 11 is a partially-enlarged view of a portion A shown in FIG. 10.

As shown in FIG. 10, in the case of the present modification, the missing portion 12 extends in a corrugated shape in plan view. Here, the "missing portion 12 extends in a corrugated shape in plan view" may indicate that the portion of the missing portion 12 crossing at least the second conductive pattern 40 extends in a corrugated shape.

With this configuration, the width dimension of the missing portion 12 in the direction of extension thereof varies as needed. Thus, even when the soluble layer 22 extends and contracts due to the humidity change, the direction of action of stress generated on the portion of the second conductive pattern 40 over the missing portion 12 can be dispersed. That is, concentration of stress on the portion of the second conductive pattern 40 over the missing portion 12 can be more reliably reduced.

More specifically, as shown in FIG. 10, each of the first extending portion 13a and the second extending portion 13b extends in a corrugated shape in plan view, as one example. On the other hand, the third extending portion 14 linearly extends in plan view.

In the case of the present modification, the bridge portions 41a, 41b as the second conductive patterns 40 extend in the direction perpendicular to each of the first extending portion 13a and the second extending portion 13b.

In plan view, each of the first extending portion 13a and the second extending portion 13b extends in the corrugated shape with constant pitch and amplitude, for example. Moreover, the first extending portion 13a and the second extending portion 13b extend with the same pitch and amplitude, for example. Note that in the present disclosure, the pitch and amplitude of each of the first extending portion 13a and the second extending portion 13b may vary in the direction of extension thereof, for example. Alternatively, the first extending portion 13a and the second extending portion 13b may extend with different pitches and amplitudes, for example.

For example, in plan view, each of the first extending portion 13a and the second extending portion 13b preferably extends in a corrugated shape with an amplitude of 1/10 or more and 1/1 or less of the pitch and more preferably a corrugated shape with an amplitude of 1/4 or more and 1/2 or less of the pitch.

More specifically, in the case of the present modification, the pitch T (see FIG. 11) of each of the first extending portion 13a and the second extending portion 13b is, for example, preferably 0.50 mm or more and 5.0 mm or less. In the case of the present modification, the pitch T of each of the first extending portion 13a and the second extending portion 13b is 1.0 mm as one example.

The amplitude A (see FIG. 11) of each of the first extending portion 13a and the second extending portion 13b is, for example, preferably 0.25 mm or more and 2.5 mm or less. In the case of the present modification, the amplitude A of each of the first extending portion 13a and the second extending portion 13b is 0.5 mm as one example.

The maximum width dimension W (see FIG. 11) of each of the first extending portion 13a and the second extending portion 13b is, for example, preferably 0.01 mm or more and 0.08 mm or less. In the case of the present modification, the maximum width dimension W of each of the first extending portion 13a and the second extending portion 13b is 0.016 mm as one example.

Third Modification of First Embodiment

Next, a third modification of the first embodiment will be described with reference to FIG. 12. Note that in FIG. 12, the thickness of each layer is schematically shown thick for the sake of convenience in easy understanding of the layer structure of the component mount board 100.

The component mount board 100 according to the present modification is different from the component mount board 100 according to the first embodiment in the following points, and on the other points, is configured similarly to the component mount board 100 according to the first embodiment.

In the case of the present modification, the water-absorption expansion material 70 is arranged on the opposite side of the second conductive pattern 40 from the base 11. When expanding by water absorption, the water-absorption expansion material 70 presses the second conductive pattern 40 in the direction perpendicular to the plane of the base 11, thereby breaking the second conductive pattern 40.

According to this configuration, external force is also applied to the second conductive pattern 40, and accordingly, the second conductive pattern 40 is broken. The state of the component mount board 100 being soaked in liquid can be more reliably sensed in such a manner that occurrence of breakage of the second conductive pattern 40 is indirectly detected by detection of the change in the properties of the circuit 60 (mainly loss of the function of the circuit 60).

Figure 12:
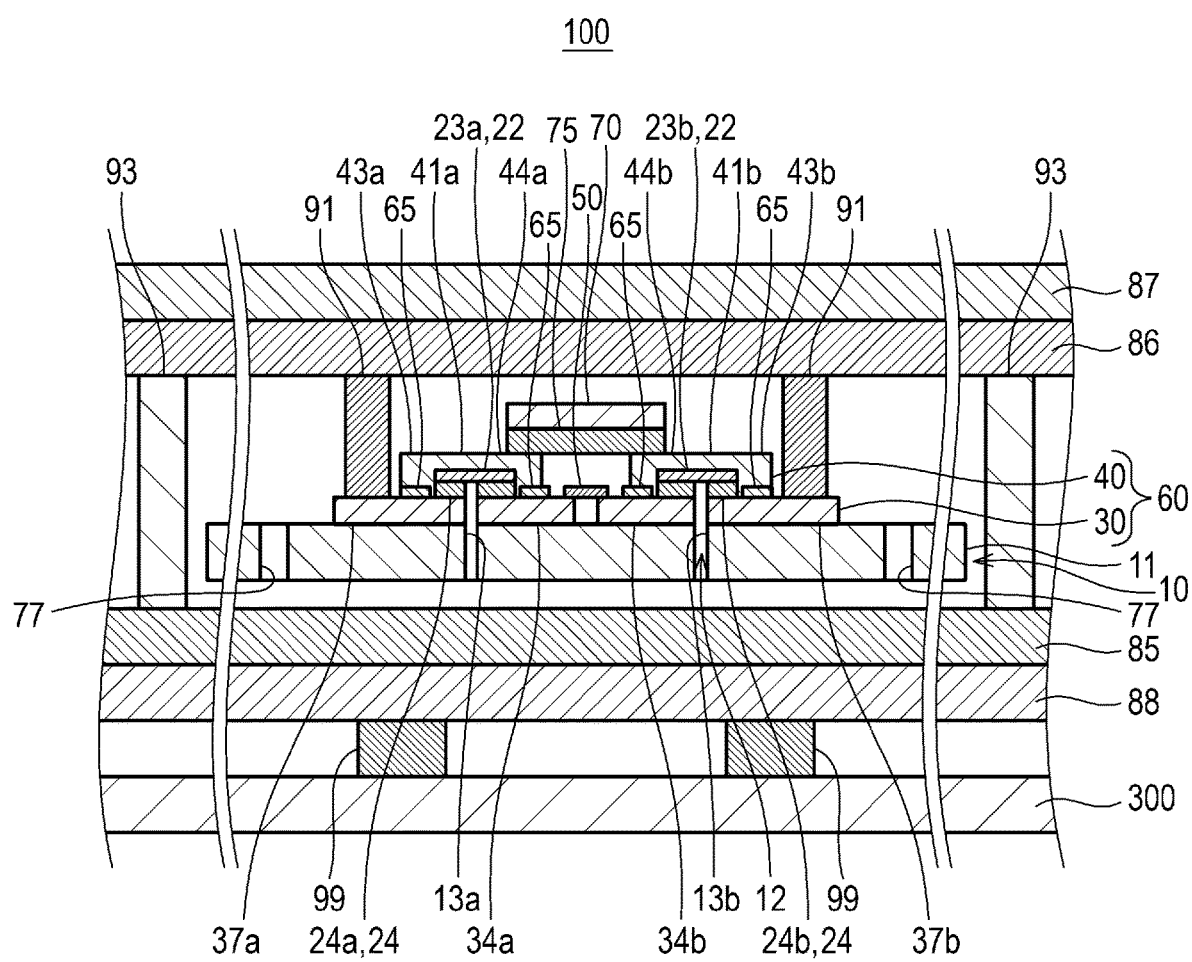
FIG. 12 is an exploded end view of a component mount board according to a third modification of the first embodiment.

More specifically, as shown in FIG. 12, the water-absorption expansion material 70 is arranged between the second conductive pattern 40 and the second water-conducting sheet 86.

The water-absorption expansion material 70 and the double-sided tape 75 are arranged, for example, over the left bridge portion 41a and the right bridge portion 41b. The double-sided tape 75 joins a left edge portion of the water-absorption expansion material 70 to the upper surface of the left bridge portion 41a, and joins a right edge portion of the water-absorption expansion material 70 to the upper surface of the right bridge portion 41b.

In the case of the present modification, a left portion of the base 11 with respect to the first extending portion 13a and a right portion of the base 11 with respect to the second extending portion 13b are joined to the lower surface of the second water-conducting sheet 86 at the first joint portions 91.

Fourth Modification of First Embodiment

Next, a fourth modification of the first embodiment will be described with reference to FIG. 13. Note that in FIG. 13, the thickness of each layer is schematically shown thick for the sake of convenience in easy understanding of the layer structure of the component mount board 100.

The component mount board 100 according to the present modification is different from the component mount board 100 according to the third modification of the first embodiment in the following points, and on the other points, is configured similarly to the component mount board 100 according to the third modification of the first embodiment.

Figure 13:
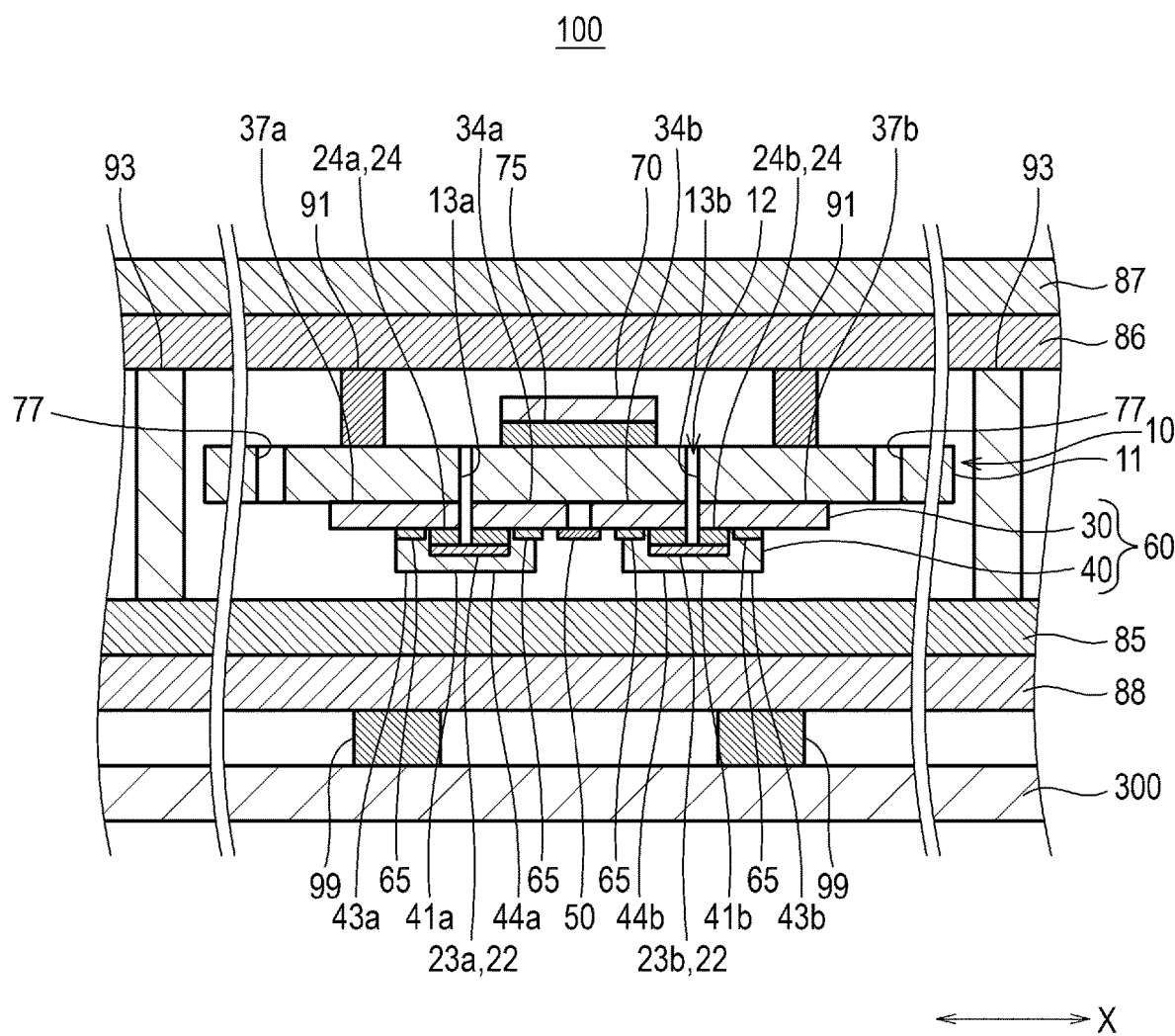
FIG. 13 is an exploded end view of a component mount board according to a fourth modification of the first embodiment.

As shown in FIG. 13, in the case of the present modification, the board 10 is arranged in a posture vertically flipped from that of the third modification of the first embodiment.

More specifically, the first conductive pattern 30 is formed on the lower surface of the base 11. The double-sided tape 24 joins the soluble layer 22 to the lower surface of the first conductive pattern 30. Moreover, the portion (intermediate portions 44a, 44b, 44c) of the second conductive pattern 40 over the missing portion 12 is formed on the lower surface of the soluble layer 22.

Further, the conductive paste 65 is provided, for example, on the lower surface of the first conductive pattern 30.

Second Embodiment

Next, a second embodiment will be described with reference to FIG. 14. Note that in FIG. 14, the thickness of each layer is schematically shown thick for the sake of convenience in easy understanding of a layer structure of a component mount board 100.

The component mount board 100 according to the present embodiment is different from the component mount board 100 according to the first embodiment in the following points, and on the other points, is configured similarly to the component mount board 100 according to the first embodiment.

Figure 14:
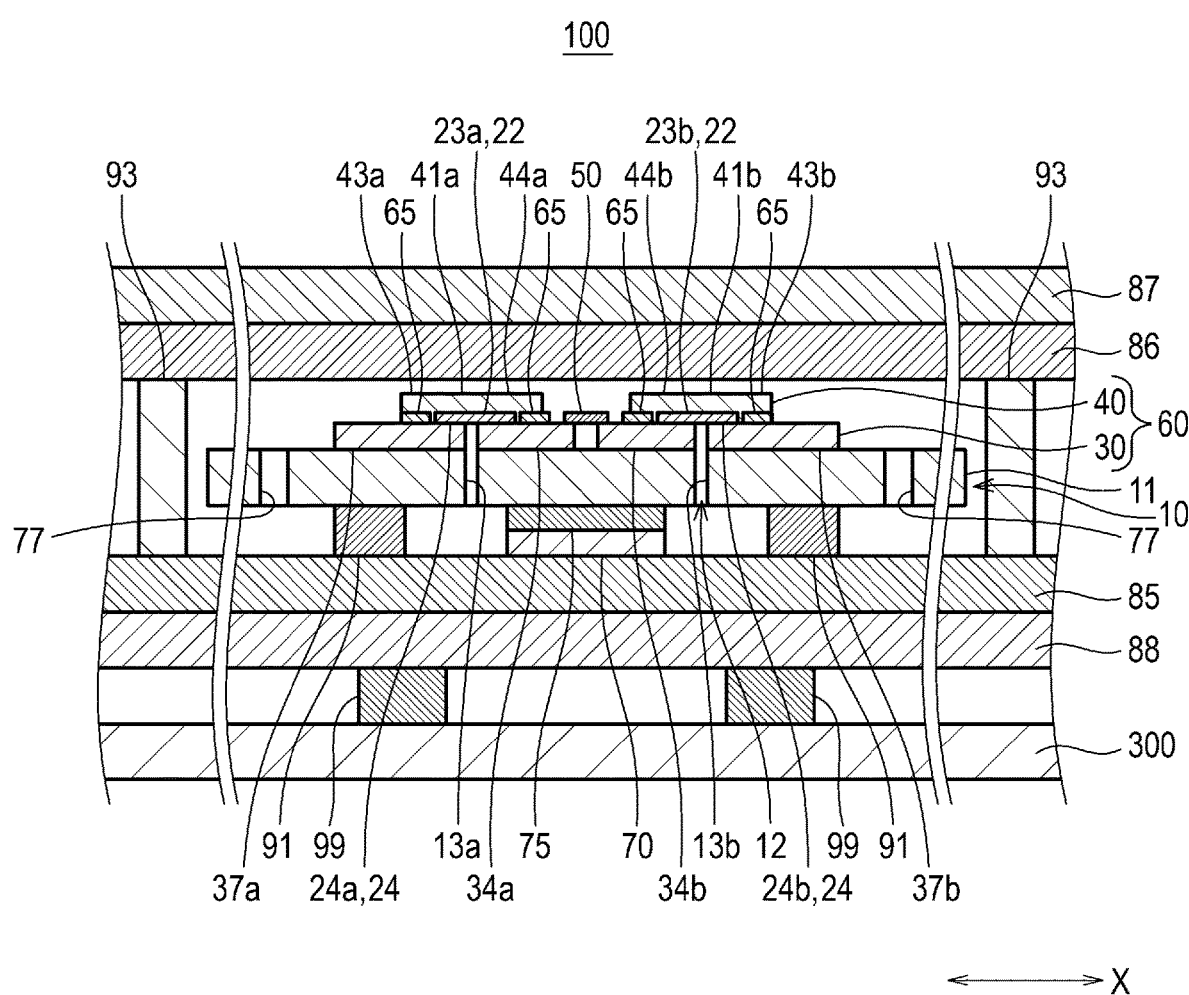
FIG. 14 is an end view of a component mount board according to a second embodiment.

As shown in FIG. 14, in the case of the present embodiment, a soluble layer 22 has adhesion. More specifically, in the case of the present embodiment, the component mount board 100 includes no double-sided tape 24 or no adhesive layer 25, and the soluble layer 22 is directly stacked on a first conductive pattern 30.

The soluble layer 22 bonds a second conductive pattern 40 and the first conductive pattern 30 to each other.

According to this configuration, liquid can more favorably contact the soluble layer 22 through a missing portion 12.

The adhesive soluble layer 22 is made, for example, of a water-soluble (or aqueous) adhesive. The adhesive forming the soluble layer 22 includes, but not specifically limited to, starch paste, acacia paste, and aqueous acrylic emulsion, for example. As an example, the aqueous acrylic emulsion is formed in such a manner that acrylic monomer containing a carboxyl group is copolymerized and alcohol and polyethylene oxide are added thereto. The soluble layer 22 may contain two or more types of water-soluble (or aqueous) adhesives.

Third Embodiment

Next, a third embodiment will be described with reference to FIGS. 15 and 16. Note that in FIGS. 15 and 16, the thickness of each layer is schematically shown thick for the sake of convenience in easy understanding of a layer structure of a component mount board 100.

The component mount board 100 according to the present embodiment is different from the component mount board 100 according to the first embodiment in the following points, and on the other points, is configured similarly to the component mount board 100 according to the first embodiment.

Figure 15:
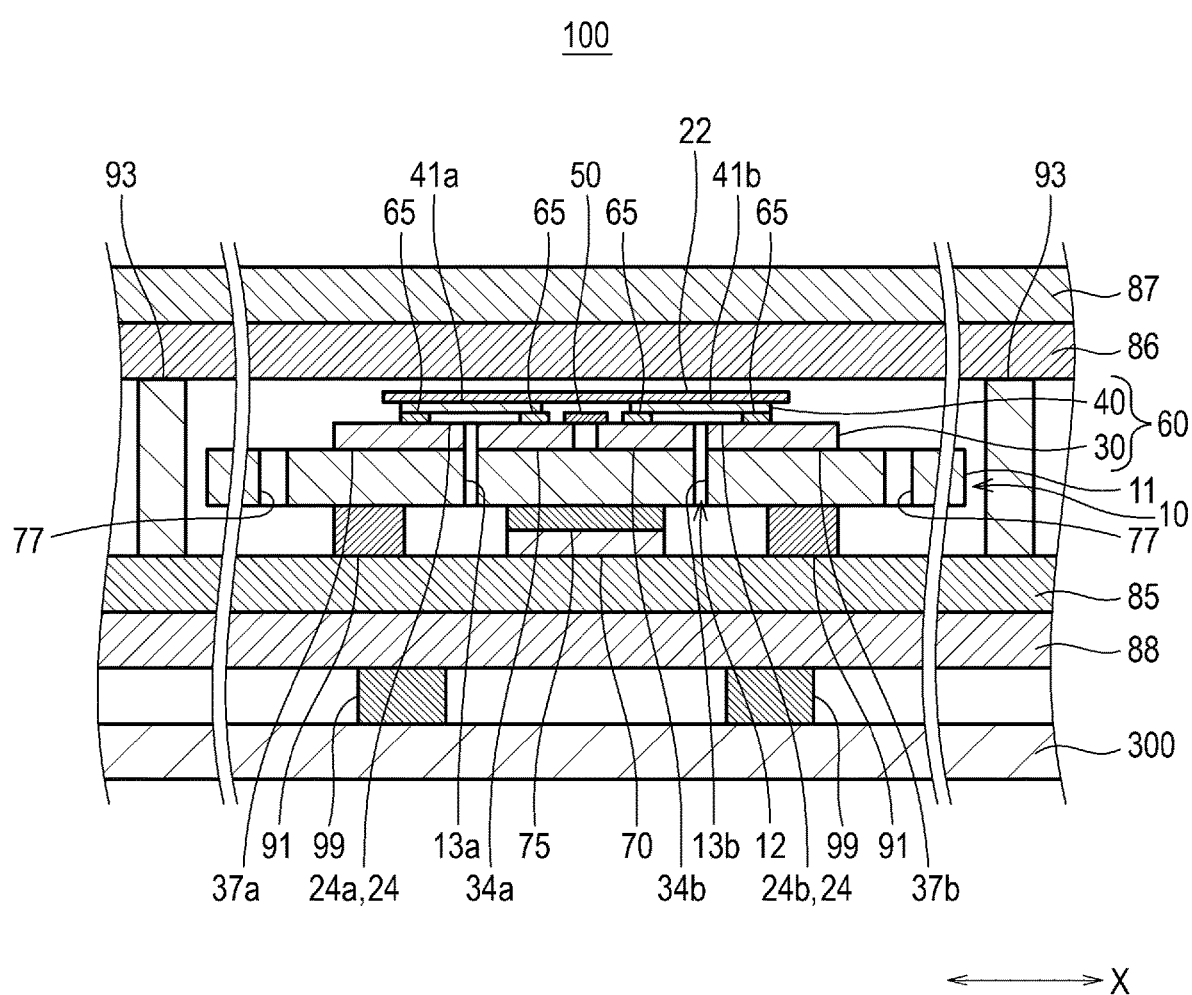
FIG. 15 is an end view of a component mount board according to a third embodiment.
Figure 16:
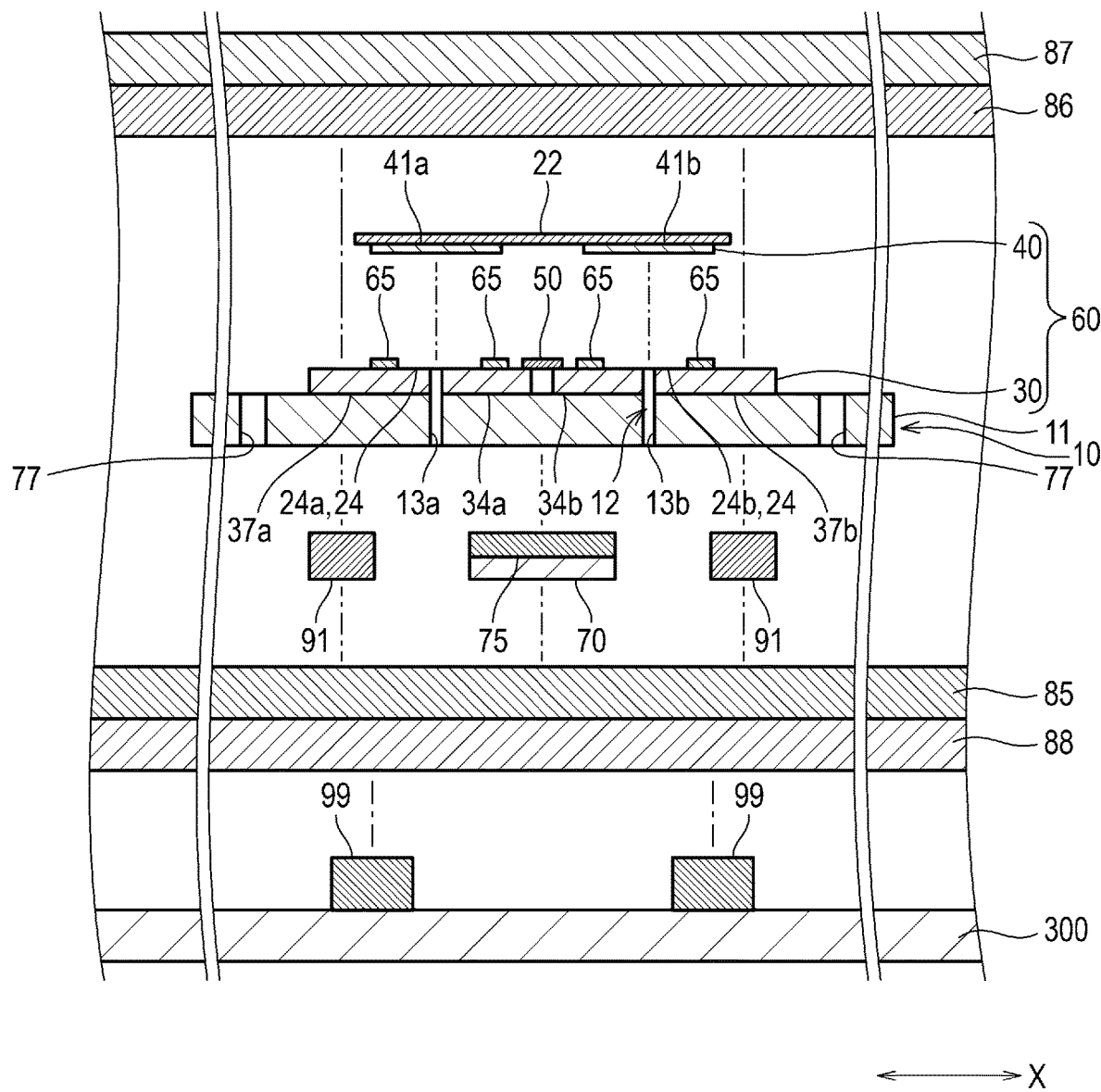
FIG. 16 is an exploded end view of the component mount board according to the third embodiment.

As shown in FIGS. 15 and 16, in the case of the present embodiment, a second conductive pattern 40 (bridge portions 41a, 42) corresponding to a first extending portion 13a and a second conductive pattern 40 (bridge portions 41b, 42) corresponding to a second extending portion 13b are formed on one surface (first surface) of a single soluble layer 22. In the case of the present embodiment, the component mount board 100 includes no double-sided tape 24.

According to this configuration, the second conductive patterns 40 do not need to be formed separately for multiple soluble layers 22, and therefore, the manufacturability of the component mount board 100 can be improved.

In the case of the present embodiment, the one surface (first surface) of the soluble layer 22 is a base-11-side surface of the soluble layer 22.

According to this configuration, liquid can more favorably contact the second conductive patterns 40 formed on the one surface of the soluble layer 22 through a missing portion 12.

In the case of the present embodiment, the entirety of the second conductive patterns 40 is formed on the one surface of the soluble layer 22.

With this configuration, the entirety of the second conductive patterns 40 can be formed flat along the one surface of the soluble layer 22.

More specifically, the single soluble layer 22 is arranged in a region including the entirety of the second conductive patterns 40 in plan view, for example. The second conductive patterns 40 are formed on the lower surface of the soluble layer 22, for example. The entirety of the second conductive patterns 40 is formed substantially flat along the lower surface of the soluble layer 22.

Conductive paste 65 is provided on the lower surfaces of both end portions of the bridge portion 41a, the lower surfaces of both end portions of the bridge portion 41b, and the lower surfaces of both end portions of the bridge portion 42. More specifically, the bridge portion 41a is bridged between the corresponding left-end-side conductive paste 65 and the corresponding right-end-side conductive paste 65. The bridge portion 41b is bridged between the corresponding left-end-side conductive paste 65 and the corresponding right-end-side conductive paste 65.

Each embodiment has been described above with reference to the drawings, but these embodiments are examples of the present disclosure and various configurations other than those described above can be employed.

For example, the example where the mount component 50 is the RFID chip has been described above, but the present disclosure is not limited to this example and the mount component 50 may be other electronic components such as a capacitor and a resistor. The component mount board 100 may be applied not only to the RFID tag, but also to near field communication (NFC), for example.

The example where the missing portion 12 (first missing portion) is the slit-shaped cutout forming portion has been described above, but the missing portion 12 may be, for example, a thin opening formed in the base 11.

Similarly, the example where the second missing portion 77 is the opening has been described above, but the second missing portion 77 may be, for example, a cutout forming portion formed in the base 11.

The present embodiments include the following technical ideas.

(1) A component mount board including
a board having a base, a first conductive pattern formed on the base, a mount component electrically connected to the first conductive pattern, and a soluble layer, and a second conductive pattern forming a circuit together with the first conductive pattern in a complementary manner, a portion of the base corresponding to the second conductive pattern being a missing portion where the base is missing, the second conductive pattern connecting, over the missing portion, a portion of the first conductive pattern and another portion of the first conductive pattern to each other, the component mount board further including a soluble layer arranged on the same side as that of the first conductive pattern with respect to the base and formed soluble in liquid, the second conductive pattern being soluble in liquid or weakened when getting wet with liquid, and a portion of the second conductive pattern at least over the missing portion being formed on one surface of the soluble layer.

(2) The component mount board according to (1), in which the width dimension of the missing portion is 1.5 mm or less.

(3) The component mount board according to (1) or (2), in which the one surface of the soluble layer is the surface of the soluble layer opposite to the base side.

(4) The component mount board according to (3), in which both portions of the soluble layer sandwiching the missing portion are bonded to the base and the first conductive pattern through a double-sided tape.

(5) The component mount board according to (3), which further includes an adhesive layer arranged over the missing portion on the base and the first conductive pattern and formed soluble in liquid, the soluble layer being formed on the adhesive layer.

(6) The component mount board according to (3), in which both end portions of the second conductive pattern are projecting portions projecting outward from the soluble layer in plan view, and each projecting portion is electrically connected to the first conductive pattern through conductive paste or a conductive adhesive.

(7) The component mount board according to (6), in which the thickness of the second conductive pattern is twice as great as the thickness of the soluble layer or more.

(8) The component mount board according to (1) or (2), in which the one surface of the soluble layer is the base-side surface of the soluble layer.

(9) The component mount board according to (8), in which the entirety of the second conductive pattern is formed on the one surface of the soluble layer.

(10) The component mount board according to (8), in which the missing portion includes a first extending portion and a second extending portion extending in parallel with each other, the second conductive pattern includes second conductive patterns each arranged corresponding to the first extending portion and the second extending portion, and the second conductive pattern corresponding to the first extending portion and the second conductive pattern corresponding to the second extending portion are formed on the one surface of a single soluble layer.

(11) The component mount board according to (1) or (2), which further includes a water-absorption expansion material, when expanding by water absorption, the water-absorption expansion material pressing the base or the second conductive pattern in a direction perpendicular to the plane of the base to break the second conductive pattern.

(12) The component mount board according to (11), in which the missing portion includes a first extending portion and a second extending portion extending in parallel with each other, the component mount board further includes a water-conducting sheet arranged so as to overlap with the base through the water-absorption expansion material, and in plan view, the water-conducting sheet and the base are joined to each other at a position outside a region where the first extending portion and the second extending portion are arranged.

(13) The component mount board according to (12), which further includes a second water-conducting sheet arranged on the opposite side of the water-absorption expansion material and the board from the water-conducting sheet, in plan view, the second water-conducting sheet and the water-conducting sheet being joined to each other at a position outside a region where the board is arranged.

(14) The component mount board according to any one of (11) to (13), which further includes a water-conducting sheet arranged so as to overlap with the base through the water-absorption expansion material, and a second water-conducting sheet arranged on the opposite side of the water-absorption expansion material and the board from the water-conducting sheet, in a portion of the base other than a region where the first conductive pattern is formed, a second missing portion being formed so as to penetrate the base and cause the water-conducting sheet side and the second water-conducting sheet side to communicate with each other.

(15) The component mount board according to any one of (1) to (14), in which the missing portion linearly extends in plan view.

(16) The component mount board according to any one of (1) to (15), in which the missing portion extends in a corrugated shape in plan view.

(17) The component mount board according to any one of (1) to (16), in which the base is not soluble in liquid.

(18) The component mount board according to any one of (1) to (17), in which the first conductive pattern is not soluble in liquid.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A component mount board comprising:
a board having a base, a first conductive pattern formed on the base, a mount component electrically connected to the first conductive pattern, and a soluble layer; and
a second conductive pattern,
wherein the soluble layer is soluble in liquid, and the second conductive pattern is soluble in liquid or is weakened when getting wet with liquid,
the base has, in a portion of the base corresponding to the second conductive pattern, a first missing portion where the base is missing,
the first conductive pattern has a first portion and a second portion separated from the first portion through the first missing portion,
the second conductive pattern connects, over the first missing portion, the first and second portions of the first conductive pattern to each other, and
a portion of the second conductive pattern at least over the first missing portion is formed on a first surface of the soluble layer.

2. The component mount board according to claim 1, wherein
a width dimension of the first missing portion is 1.5 mm or less.

3. The component mount board according to claim 1, wherein
the first surface of the soluble layer is a surface of the soluble layer opposite to a base side.

4. The component mount board according to claim 3, further comprising:
a double-sided tape,
wherein the double-sided tape is arranged around the first missing portion on the base and the first conductive pattern, and
a second surface, which is a base-side surface, of the soluble layer is bonded to the base and the first conductive pattern with the double-sided tape.

5. The component mount board according to claim 3, further comprising:
an adhesive layer,
wherein the adhesive layer is soluble in liquid, and is arranged over the first missing portion on the base and the first conductive pattern, and
a second surface, which is a base-side surface, of the soluble layer is bonded to the base and the first conductive pattern with the adhesive layer.

6. The component mount board according to claim 3, wherein
the second conductive pattern has projecting portions at both ends,
each projecting portion projects outward from the soluble layer in plan view, and
each projecting portion is electrically connected to the first conductive pattern through conductive paste or a conductive adhesive.

7. The component mount board according to claim 6, wherein
a thickness of the second conductive pattern is twice as great as a thickness of the soluble layer or more.

8. The component mount board according to claim 1, wherein
the first surface of the soluble layer is a base-side surface of the soluble layer.

9. The component mount board according to claim 8, wherein
an entirety of the second conductive pattern is formed on the first surface of the soluble layer.

10. The component mount board according to claim 8, wherein
the first missing portion includes a first extending portion and a second extending portion extending in parallel with each other,
the second conductive pattern includes second conductive patterns each arranged corresponding to the first extending portion and the second extending portion, and
the second conductive pattern corresponding to the first extending portion and the second conductive pattern corresponding to the second extending portion are formed on the first surface of a single soluble layer.

11. The component mount board according to claim 1, further comprising:
a water-absorption expansion material,
wherein the water-absorption expansion material expands by water absorption and presses the base or the second conductive pattern in a direction perpendicular to a plane of the base to break the second conductive pattern.

12. The component mount board according to claim 11, further comprising:
a first water-conducting sheet,
wherein the first missing portion includes a first extending portion and a second extending portion extending in parallel with each other,
the first water-conducting sheet is arranged so as to overlap with the base through the water-absorption expansion material, and
in plan view, the first water-conducting sheet and the base are joined to each other at a position outside a region where the first extending portion and the second extending portion are arranged.

13. The component mount board according to claim 12, further comprising:
a second water-conducting sheet,
wherein the second water-conducting sheet is arranged on an opposite side of the water-absorption expansion material and the board from the first water-conducting sheet, and
in plan view, the second water-conducting sheet and the first water-conducting sheet are joined to each other at a position outside a region where the board is arranged.

14. The component mount board according to claim 11, further comprising:
a first water-conducting sheet;
a second water-conducting sheet; and
a second missing portion,
wherein the first water-conducting sheet is arranged so as to overlap with the base through the water-absorption expansion material, and the second water-conducting sheet is arranged on an opposite side of the water-absorption expansion material and the board from the first water-conducting sheet, and
in a portion of the base other than a region where the first conductive pattern is formed, the second missing portion is formed so as to penetrate the base and cause a first water-conducting sheet side and a second water-conducting sheet side to communicate with each other.

15. The component mount board according to claim 1, wherein
the first missing portion linearly extends in plan view.

16. The component mount board according to claim 1, wherein
the first missing portion extends in a corrugated shape in plan view.

17. The component mount board according to claim 1, wherein
the base is not soluble in liquid.

18. The component mount board according to claim 1, wherein
the first conductive pattern is not soluble in liquid.

* * * * *